United States Patent
Sayem et al.

(10) Patent No.: US 10,484,958 B2
(45) Date of Patent: Nov. 19, 2019

(54) CONDUCTIVE WATCH HOUSING WITH SLOT ANTENNA CONFIGURATION

(71) Applicant: Garmin Switzerland GmbH, Schaffhausen (CH)

(72) Inventors: Abu T. Sayem, Overland Park, KS (US); Matthew L. Russell, Olathe, KS (US)

(73) Assignee: Garmin Switzerland GmbH (CH)

( * ) Notice: Subject to any disclaimer, the term of this patent is extended or adjusted under 35 U.S.C. 154(b) by 0 days.

(21) Appl. No.: 16/293,327

(22) Filed: Mar. 5, 2019

(65) Prior Publication Data

US 2019/0215794 A1    Jul. 11, 2019

Related U.S. Application Data

(63) Continuation of application No. 15/863,311, filed on Jan. 5, 2018, now Pat. No. 10,271,299.

(51) Int. Cl.

| *H04W 64/00* | (2009.01) |
|---|---|
| *H01Q 1/27* | (2006.01) |
| *H01Q 1/50* | (2006.01) |
| *H05K 7/14* | (2006.01) |

(Continued)

(52) U.S. Cl.
CPC ............ *H04W 64/00* (2013.01); *H01Q 1/273* (2013.01); *H01Q 1/48* (2013.01); *H01Q 1/50* (2013.01); *H01Q 13/10* (2013.01); *H05K 7/1427* (2013.01)

(58) Field of Classification Search
CPC ..... H04W 64/00; H04W 88/00; H04W 88/02; H04W 4/02; H01Q 1/273; H01Q 1/50; H01Q 13/10; H01Q 1/48
See application file for complete search history.

(56) References Cited

U.S. PATENT DOCUMENTS

| 5,559,760 A | 9/1996 | Schneider |
| 5,757,326 A | 5/1998 | Koyama et al. ............... 343/702 |
| 6,028,561 A | 2/2000 | Takei ............................ 343/767 |

(Continued)

OTHER PUBLICATIONS

Printout from http://www.antenna-theory.com/antennas/aperture/slot.php; published prior to Mar. 29, 2017.

(Continued)

*Primary Examiner* — Jean A Gelin
(74) *Attorney, Agent, or Firm* — Samuel M. Korte; Max M. Ali

(57) ABSTRACT

A wrist-worn electronic device includes a lower housing, including a lower surface and a side wall formed of electrically conductive material, an upper housing including a bezel formed of an electrically conductive material, and an antenna formed by a nonconductive slot between the lower and upper housings. The nonconductive slot may be formed between a first portion of a lower surface of the bezel along a circumference of the bezel, a first portion of a top surface of the side wall along a circumference of the side wall, and electrical connections between two electrical ground terminals on the top surface of the side wall and the two electrical ground locations on the lower surface of the bezel. The antenna may be configured to transmit or receive electronic signals to determine a current geographic location or allow wireless communication with other electronic devices.

20 Claims, 15 Drawing Sheets

(51) Int. Cl.
*H01Q 13/10* (2006.01)
*H01Q 1/48* (2006.01)

(56) References Cited

U.S. PATENT DOCUMENTS

| | | | | |
|---|---|---|---|---|
| 6,535,461 | B1* | 3/2003 | Karhu | G04C 3/001 |
| | | | | 368/10 |
| 7,327,324 | B2 | 2/2008 | Wang | 343/767 |
| 7,379,712 | B2* | 5/2008 | Saarnimo | H04B 1/385 |
| | | | | 343/741 |
| 7,612,725 | B2 | 11/2009 | Hill et al. | 343/702 |
| 9,640,858 | B1* | 5/2017 | Islam | H01Q 1/273 |
| 10,271,299 | B1 | 4/2019 | Sayem et al. | |
| 10,276,925 | B2 | 4/2019 | Han | |
| 2005/0219955 | A1 | 10/2005 | Xu | |
| 2013/0181873 | A1 | 7/2013 | Gutschenritter et al. | |
| 2014/0225786 | A1* | 8/2014 | Lyons | H01Q 1/273 |
| | | | | 343/702 |
| 2014/0266920 | A1* | 9/2014 | Tran | H01Q 1/243 |
| | | | | 343/702 |
| 2014/0354494 | A1 | 12/2014 | Katz | |
| 2015/0188217 | A1 | 7/2015 | Tsai et al. | |
| 2015/0255855 | A1 | 9/2015 | Tsai et al. | |
| 2015/0349410 | A1* | 12/2015 | Russell | H01Q 1/273 |
| | | | | 343/702 |
| 2016/0006110 | A1 | 1/2016 | Jain | |
| 2016/0013544 | A1 | 1/2016 | Lyons et al. | |
| 2016/0056533 | A1 | 2/2016 | Nissinen | |
| 2016/0255733 | A1 | 9/2016 | Jung | |
| 2016/0308272 | A1* | 10/2016 | Standke | G04G 21/04 |
| 2017/0018842 | A1 | 1/2017 | Santo | |
| 2017/0033439 | A1 | 2/2017 | Liu et al. | |
| 2017/0062912 | A1* | 3/2017 | Shewan | H01Q 1/273 |
| 2017/0179581 | A1 | 6/2017 | Puuri | |
| 2017/0358850 | A1 | 12/2017 | Vanjani | |
| 2017/0373381 | A1 | 12/2017 | Robinson | |
| 2018/0129170 | A1 | 5/2018 | Yun | |
| 2018/0287248 | A1 | 10/2018 | Han | |

OTHER PUBLICATIONS

Printout from http://www.antenna-theory.com/antennas/aperture/ifa.php; published prior to Mar. 29, 2017.
International Search Report and Written Opinion from corresponding PCT/US2018/025146, filed Mar. 29, 2018.
International Search Report and Written Opinion from corresponding PCT/US2018/064419, filed Dec. 7, 2018.

* cited by examiner

CONDUCTIVE WATCH HOUSING WITH SLOT ANTENNA CONFIGURATION

CROSS-REFERENCE TO RELATED APPLICATIONS

The present application is a continuation of, and claims priority benefit to, U.S. patent application Ser. No. 15/863,311, filed Jan. 5, 2018, entitled "CONDUCTIVE WATCH HOUSING WITH SLOT ANTENNA CONFIGURATION." The above referenced application is herein incorporated by reference in its entirety.

BACKGROUND

Conventional wrist-worn electronic devices may be configured to accommodate an antenna formed by an electrically conductive bezel, a printed circuit board providing a ground plane, and electrical connections to two electrical ground terminals to form a nonconductive slot. Such a conventional electronic device is illustrated in FIG. 2. As disclosed in U.S. patent application Ser. No. 15/473,187, the slot antenna may be electrically coupled with a location determining component or a communication element to transmit or receive electronic signals to determine a current geographic location or enable wireless communication with other electronic devices. The bezel may have electrical connections to an electronic signal terminal and two electrical ground terminals.

Other conventional wrist-worn electronic devices may include a housing and a slot antenna, located entirely within the wrist-worn electronic device housing, that may be controlled to transmit and receive communication signals or receive location information. For instance, the slot may be formed using a plastic carrier or a plurality of vertical supports positioned on the printed circuit board. Other conventional antenna configurations utilize a slot formed from or within an opening defined by a ground plane and a bezel. Specifically, the ground plane may have a slot (opening) and one or more antenna resonating elements may be formed above the slot to increase the distance between the resonating elements and the ground plane. If a printed circuit board of a device forms at least a portion of a ground plane of an antenna, the slot may be formed within the printed circuit such that it may be visible from a top view of the device.

Wrist-worn electronic devices often include functionality that may be used to track a user's current location, distance traveled, velocity, and other performance metrics or data. This functionality may be provided by wirelessly receiving positional information from a satellite-based positioning system such as the global positioning system (GPS). In addition, such devices may communicate wirelessly with other electronic devices, systems, or networks using communication protocols such as Bluetooth™, Wi-Fi™, or cellular signals. One or more antennas may be included in the electronic devices to wirelessly receive signals from GPS satellites and provide wireless communication with other electronic devices, systems, or networks.

The bezel of some conventional wrist-worn electronic devices may partially form an antenna that wirelessly transmits or receives electronic signals. This principle has been used heretofore in wrist-worn electronic devices, such as watches, having a housing, bezel, and an antenna configured to transmit and receive signals communication systems or devices (e.g., Bluetooth™, Wi-Fi™, ANT™, etc.) and/or receive location signals from a satellite-based positioning system (e.g., GPS), where the antenna is integrated with at least a portion of the bezel and coupled with a conductive component at least partially positioned in an internal cavity of the housing. As disclosed in U.S. Pat. No. 9,172,148, an antenna may be capacitively coupled with the conductive component positioned in an internal cavity of the housing. As disclosed in U.S. Pat. No. 9,257,740, an antenna may be electrically connected to a second antenna at least partially enclosed within an internal cavity of the housing. The antenna or a portion thereof may include an inverted-F configuration, which typically includes an upper arm (radiating leg), a signal feed connection to the upper arm from a ground plane, and a shorting pin connection to the upper arm electrically grounding the upper arm at the location of the shorting pin connection. The two connections to the upper arm (for the signal feed and the shorting pin) results in a configuration having an open end opposite the location of the shorting pin connection. The length of an inverted-F antenna is typically measured using the length of the upper arm from the open end to the opposite end of the upper arm, which is typically the location of the shorting pin connection. The length of the upper arm is commonly one-fourth (one-quarter) of a wavelength of an electrical signal transmitted or received by the inverted-F antenna. The signal feed connection to the upper arm is typically closer to the shorting pin connection than the open end of the inverted-F antenna. However, the location of the signal feed connection may be switched with the location of the shorting pin connection, such that the open end is opposite the location of the signal feed connection.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments of the present technology provide a wrist-worn electronic device including a lower housing, having a lower surface and a side wall formed of electrically conductive material, an upper housing including a bezel formed of an electrically conductive material, and an antenna formed by a nonconductive slot between the lower and upper housings. The antenna may be electrically coupled with a location determining component or a communication element to transmit or receive electronic signals to determine a current geographic location or to allow wireless communication with other electronic devices.

Embodiments of the present technology include a wrist-worn electronic device including a location determining element and a first antenna formed by a nonconductive slot between a lower housing and an upper housing. The lower housing may include a lower surface, a printed circuit board positioned above the lower surface, and a side wall formed of electrically conductive material. The side wall may have a top surface including a plurality of electrical ground terminals. The upper housing may oppose the lower housing and may include a bezel formed of an electrically conductive material. The bezel may have a lower surface corresponding to the top surface of the side wall and two electrical ground locations electrically coupled to two of the plurality of electrical ground terminals on the top surface of the side wall. The nonconductive slot may be formed between a first portion of the lower surface of the bezel along a circumference of the bezel between the two electrical ground locations, a first portion of the top surface of the side wall along a circumference of the side wall corresponding to the first portion of the lower surface of the bezel, and two electrical ground contacts each electrically coupling one of the two electrical ground terminals on the top surface of the side wall with one of the two electrical ground locations on the lower surface of the bezel, respectively. A first electrical signal contact may electrically couple a first electronic signal terminal with the bezel at a position along the first portion of the circumference of the bezel between the first pair of electrical ground locations. The location determining element may be positioned on the printed circuit board, electrically coupled to the first electronic signal terminal, and may be configured to receive the first electronic signal from the first electronic signal terminal and determine a current geolocation of the electronic device based on the first electronic signal.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present technology will be apparent from the following detailed description of the embodiments and the accompanying drawing figures.

BRIEF DESCRIPTION OF THE DRAWING FIGURES

Embodiments of the present technology are described in detail below with reference to the attached drawing figures, wherein.

Figure 1A:
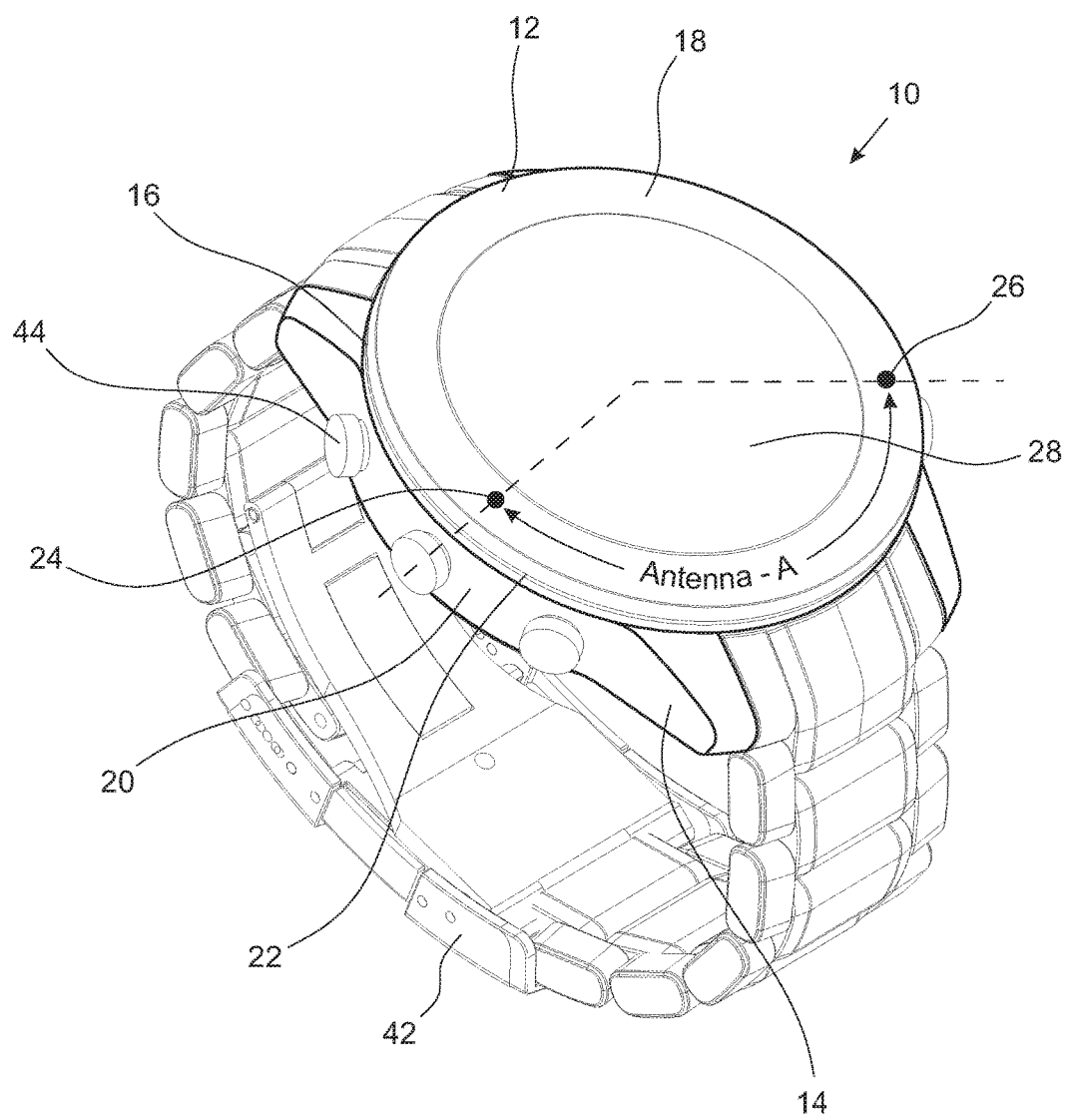
FIG. 1A is a perspective view of a wrist-worn electronic device incorporating an improved antenna configuration, constructed in accordance with embodiments of the present technology.

The drawing figures do not limit the present technology to the specific embodiments disclosed and described herein. The drawings are not necessarily to scale, emphasis instead being placed upon clearly illustrating the principles of the technology.

DETAILED DESCRIPTION

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the present technology. The following detailed description is, therefore, not to be taken in a limiting sense. The scope of the present technology is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Embodiments of the present technology provide an electronic device that includes an antenna formed by a nonconductive slot between an upper housing and a lower housing, each formed of an electrically conductive material. The upper housing may oppose the lower housing and may include a bezel formed of an electrically conductive material. The lower housing may include a lower surface and a side wall formed of electrically conductive material. An electrically nonconductive ring may be positioned between a lower surface of the bezel and a top surface of the side wall to enclose an internal cavity 46 of the combined upper and lower housings.

Embodiments of the technology will now be described in more detail with reference to the drawing figures. Referring initially to FIGS. 1 and 3-5, an exemplary wrist-worn electronic device 10 is illustrated.

As shown in FIGS. 1A and 3-4B, an electronic device 10 may include an upper housing 12, a lower housing 14, and a ring 16 formed of electrically nonconductive material. The upper housing 12 may include a bezel 18 formed of electrically conductive material and the lower housing 14 may include one or more side walls 20 formed of electrically conductive material. An antenna 22 may be formed within a portion of the ring 16 that extends along a portion of the bezel 18. For example, the antenna 22 may extend along a circumference of the bezel 18 between locations associated with a first electrical ground location 24 and a second electrical ground location 26 (depicted on the top surface of bezel 18 for illustrative purposes only). For illustration purposes only, the portion of the bezel 18 associated with the antenna 22 is labeled "Antenna A" and the electrical ground locations 24, 26 are identified on the top surface of bezel 18. A corresponding portion of the side wall 20, positioned under ring 16, is also associated with the antenna 22 and the electrical ground locations 24, 26 are located on a lower surface of the bezel 18. The electronic device 10 may also include a display 28 to present information to a user and a wrist band 42, a strap, or other attachment mechanisms.

Figure 2:
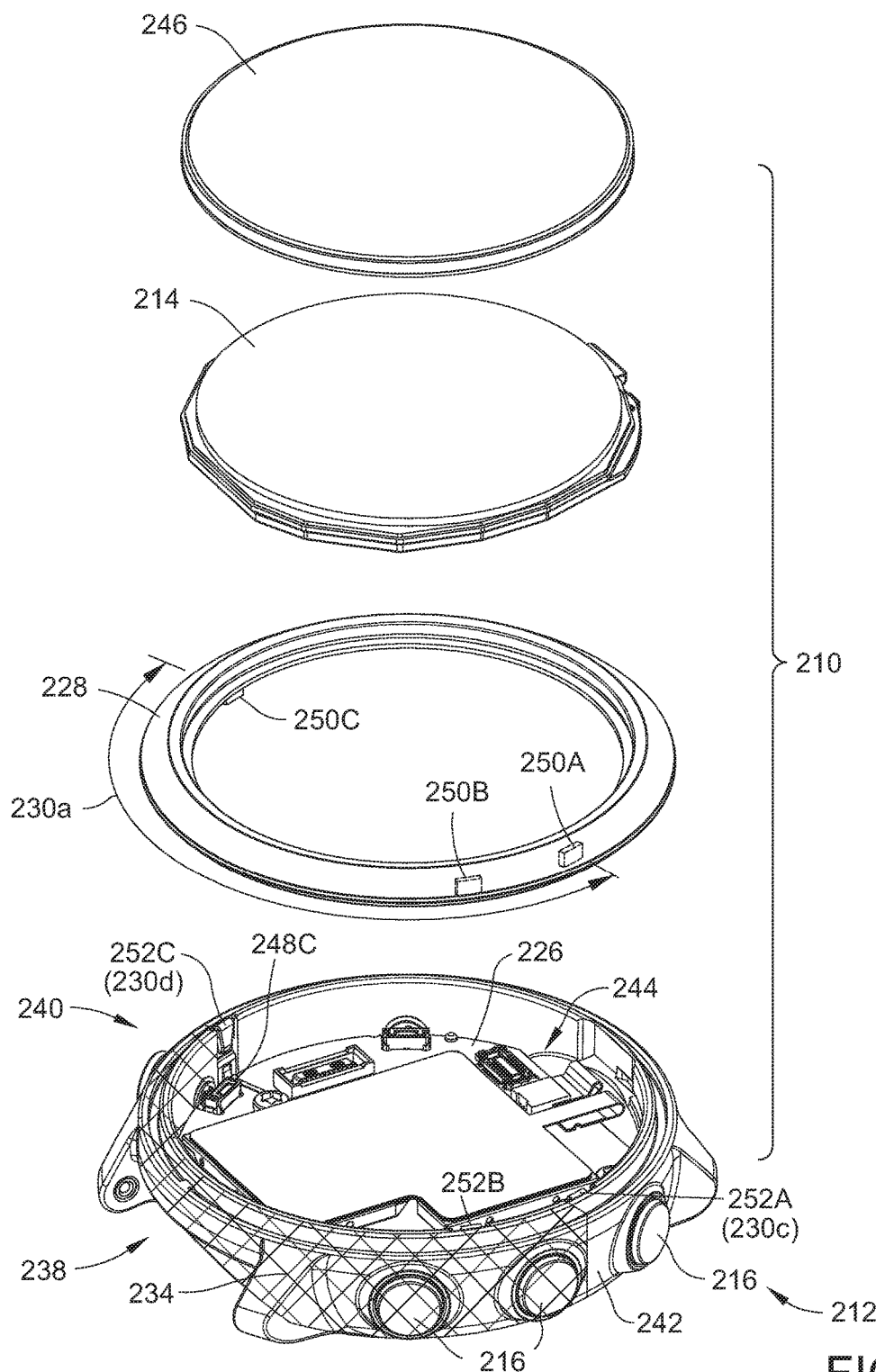
FIG. 2 is an exploded perspective view, from opposing sides, of a conventional electronic device, illustrating a display and a bezel removed from a housing, the housing including additional components which, along with the bezel, form a slot antenna.

A conventional electronic device including a slot antenna is illustrated in FIG. 2, which corresponds to a Figure of U.S. patent application Ser. No. 15/473,187. The electronic device 210 includes an antenna 230 formed by a nonconductive slot 234. The antenna 230 may be electrically coupled with a location determining component or a communication element to transmit or receive electronic signals to determine a current geographic location or enable wireless communication with other electronic devices. The conventional electronic device 210 broadly includes a housing 212, a display 214, a printed circuit board 226, a bezel 228.

The housing 212 of the conventional electronic device includes a side wall 242 formed of an electrically nonconductive material, such as ceramic, plastic, or combinations thereof. The nonconductive slot 234 through which the electric field of first antenna 230 passes includes a portion of nonconductive side wall 242. Antenna 230 is a slot antenna having a nonconductive slot 234 in which the "slot" is formed or bound by an upper portion 230a, a lower portion 230b (not labeled), and spring contacts 252A, 252C serving as side portions 230c, 230d, respectively, of the antenna 230. Because the nonconductive side wall 242 of the electronic device 210 illustrated in FIG. 2 is formed of an electrically nonconductive material(s), the height of each spring contact 252A-252C is approximately equal to the height of the nonconductive side wall 242, and may be positioned against an inner surface of the nonconductive side wall 242, to electrically couple the bezel 228 with electrical ground terminals 248A-248C. A first portion of a circumference of the electrically conductive bezel 228 may form an upper portion 230a of nonconductive slot 234. The lower portion 230b (not labeled) of nonconductive slot 234 corresponds to a perimeter of printed circuit board 226 between two electrical ground terminals 248A and 248C (not shown). The corners of the nonconductive slot 234 are formed by a tab 250A of the bezel 228, a tab 250C of the bezel 228, and the two electrical ground terminals 248A and 248C (not shown). The two electrical ground terminals 248A and 248C are electrically coupled to tabs 250A, 250C of the bezel 228. A spring contact 252B electrically couples an electronic signal terminal 248B (providing an electrical signal feed (F) connection) to a tab 250B of the bezel 228.

Unlike the conventional electronic device illustrated in FIG. 2, embodiments of the present technology enable use of one or more side walls formed of electrically conductive material, which may include metal, electrically conductive ceramic, electrically conductive plastic, or combinations thereof. The electronic device constructed in accordance with embodiments of the present technology can be worn on a user's wrist and that includes an improved antenna design.

Figure 1B:
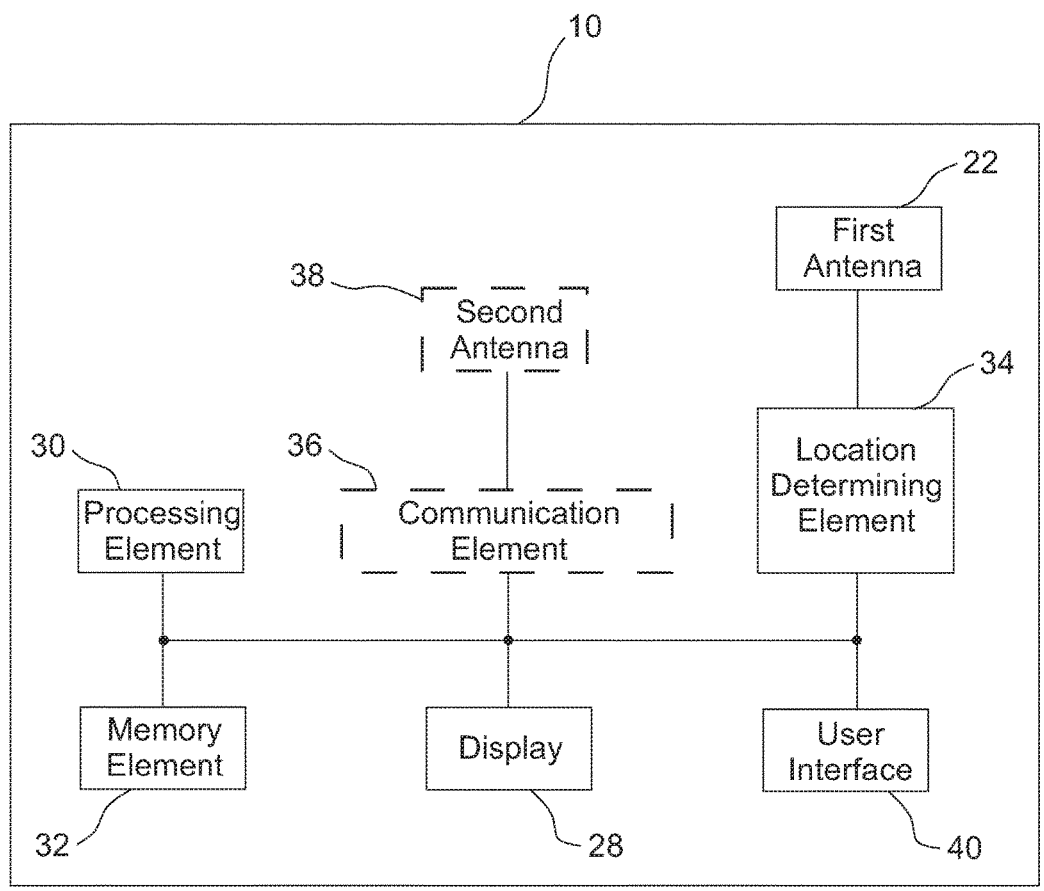
FIG. 1B is a schematic block diagram illustrating electrically coupled functional components of the electronic device of FIG. 1A.

As shown in FIG. 1B, the electronic device 10 broadly comprises a processing element 30, a memory element 32, display 28, a user interface 40, a location determining element 34, and a first antenna 22. In various embodiments, as detailed herein, the electronic device 10 may further include a communication element 36 and a second antenna 80. The lower housing 14, may include a lower surface configured to contact a user's wrist and one or more side walls, an opposing upper housing 12 including a bezel 18, and a nonconductive ring 16 together form an internal cavity 46. In embodiments, the side wall 20 may include one or more openings for depressible buttons 44. The upper housing 12 and lower housing 14 may be shaped such that the electronic device 10 has a circular face (e.g., a circular watch face) and the bezel 18 may be annular in shape, as shown in FIG. 1A.

The electronic device 10 may be a watch, a wrist-worn smart phone, a wrist-worn navigation device, or other wearable multi-function electronic devices that include a housing and a wrist band 42, strap, or other attachment mechanism to secure the electronic device 10 to a user's wrist. Although the electronic device 10 is typically worn on a wrist, it may also be worn on other parts of the body such as the forearm or the upper arm. The user wearing the electronic device 10 may be involved in activities such as street running, trail running, jogging, hiking, walking, biking, swimming, exercising, etc. During these activities, the electronic device 10 may monitor the user's current location, distance traveled, velocity, and other performance metrics by receiving wireless location signals from a satellite-based positioning system such as the global positioning system (GPS). In addition, the electronic device 10 may be wirelessly paired with other devices such as a heart rate monitor worn around the user's chest, a foot pod attached to the user's shoe for measuring jogging or running cadence and distance, a bike speed and cadence sensor attached to a crank arm and wheel hub of the user's bicycle for tracking biking performance, and so forth. Furthermore, the electronic device 10 may be able to communicate with smartphones, tablets, laptop or desktop computers, Wi-Fi routers, cell towers, and the like to allow the user to upload activity data, download apps, receive text messages, emails, and weather alerts, and so on.

In some embodiments, as shown in FIGS. 3, 4A-4B, 6, and 7A-7B, one or more electronic signal terminals 58, 72 are illustrated as being positioned above side wall 20. Because side wall 20 is formed of electrically conductive material and side wall 20 may provide a ground plane for one or more antennas, the electronic signal terminals 58, 72 are separated from the side wall 20 by nonconductive ring 16 or by an air gap.

The electronic device 10 may include a printed circuit board 50 that retains one or more electronic components that process electronic signals. The electronic signal terminals 58, 72 are each operable to provide a signal feed (F) to the one or more electronic components, such as the location determining component 34 and/or the communication element 36. The printed circuit board 50 may be positioned within the internal cavity 46 enclosed by a circular lower surface. The printed circuit board 50 may be substantially circular, rectangular, or square in shape. In embodiments, the printed circuit board 50 may have an irregular shaped such that it is partially circular and partially rectangular.

In some embodiments, the printed circuit board 50 on one of the electronic components, such as the location determining component 34 and/or the communication element 36, include one or more electronic signal terminals that are electrically coupled with the electronic signal terminals 58, 72. In other embodiments, the one or more electronic signal terminals 58, 72 may be the located on the printed circuit board 50 and an electrically conductive element (e.g., pin, wire, cable, etc.) may electrically contact the bezel 18 directly or indirectly via a conductive post 64. As such, in embodiments, the printed circuit board 50 may include at least two electronic signal terminals that are each electrically coupled with a coaxial cable that contacts electronic signal terminals 58, 72, which are positioned above side wall 20, and the electronic signal terminals 58, 72 may be electrically coupled with conductive posts 64, 78.

The printed circuit board 50 may provide a ground plane for one or more antennas, including the first antenna 22. The printed circuit board 50 includes one or more electrical ground terminals operable to provide electrical ground point 90 for the side wall 20, the electrical ground terminals positioned on a top surface of the side wall 20, and any electrically conductive contacts 52 to be electrically grounded. A perimeter of the printed circuit board 50 may be positioned adjacent to a lower portion of side wall 20 of the lower housing 14. In embodiments, the printed circuit board 50 may be electrically coupled to the lower housing 14 and thereby extend the ground plane to the electrically conductive portions of the lower housing 14. In embodiments, the printed circuit board 50 and lower housing 14 may be electrically coupled to a strap 42 formed of an electrically conductive material, such as metal. For instance, a conductive contact may extend from the lugs of the lower housing 14 and physically contact a portion of the strap 42 to extend the ground plane for the first antenna 22 to the strap 42. Thus, the electrically conductive plane of first antenna 22, which is a slot antenna, may be provided by the ground plane of the printed circuit board 50, the lower housing 14, and the strap 42.

Figure 3:
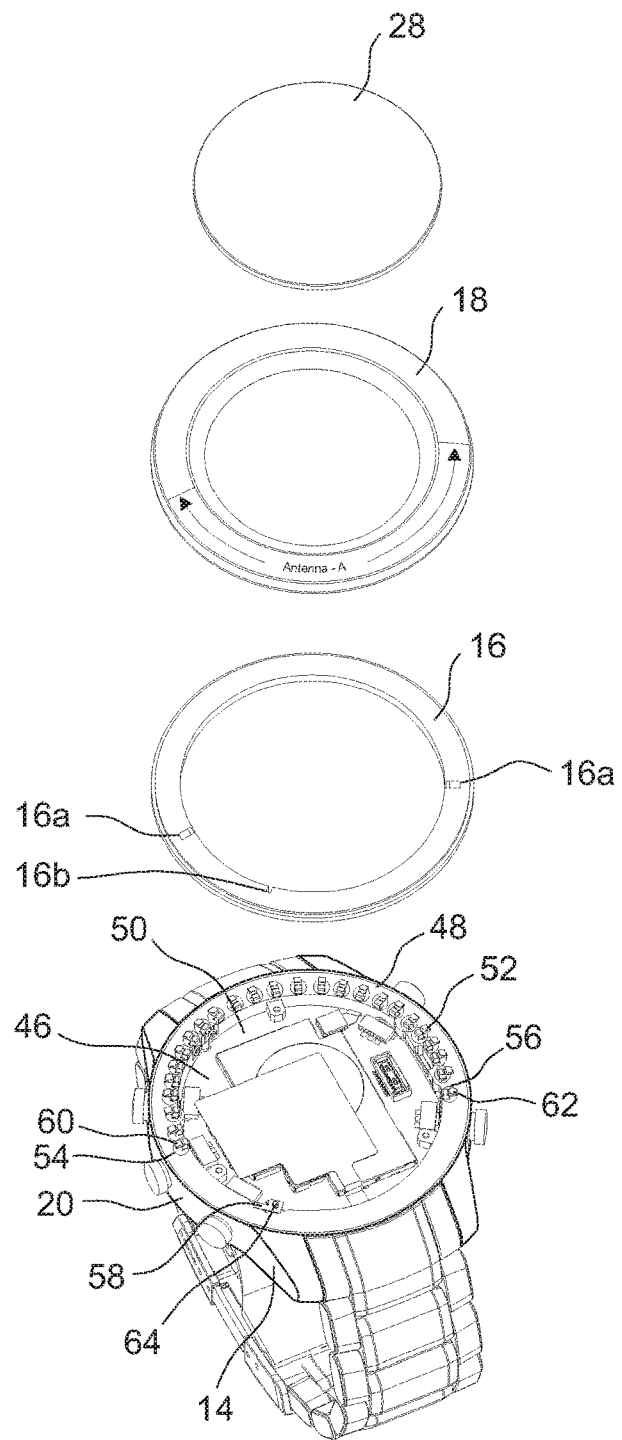
FIG. 3 is an exploded perspective view, from opposing sides, of the electronic device of FIG. 1, illustrating a display, a bezel, and a ring removed from a housing, the housing including additional components which, along with the bezel, form a slot antenna.
Figure 5A:
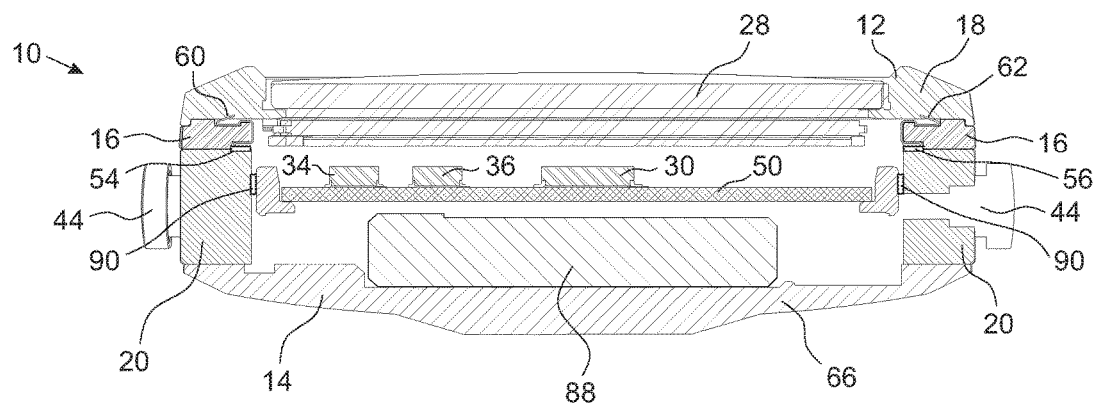
FIG. 5A is a vertical cross-section view of the internal components of the electronic device of FIG. 1 as seen through the A-A line of FIGS. 4A and 4B, further illustrating an example of the upper housing, the lower housing, and the slot antenna.
Figure 5B:
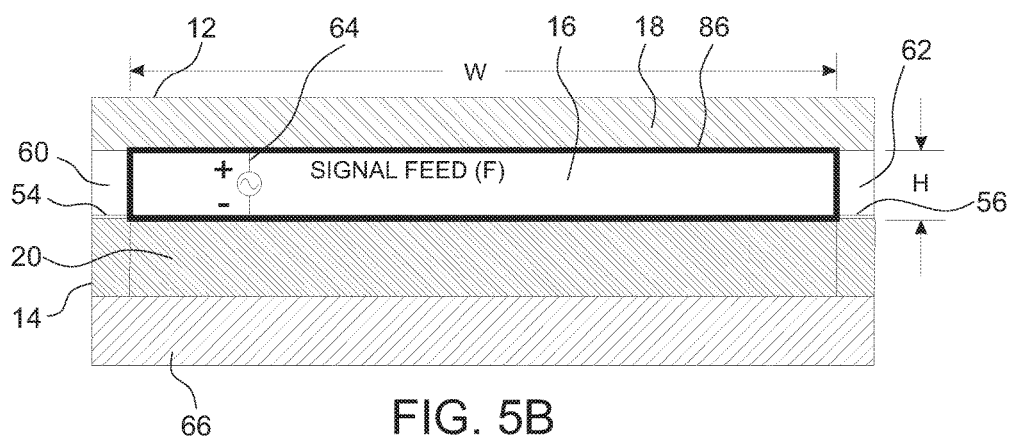
FIG. 5B is a diagrammatic, simplified, side view of the internal components of the electronic device of FIGS. 4A and 4B, further illustrating an example of the upper housing, the lower housing, and the slot antenna.
Figure 6:
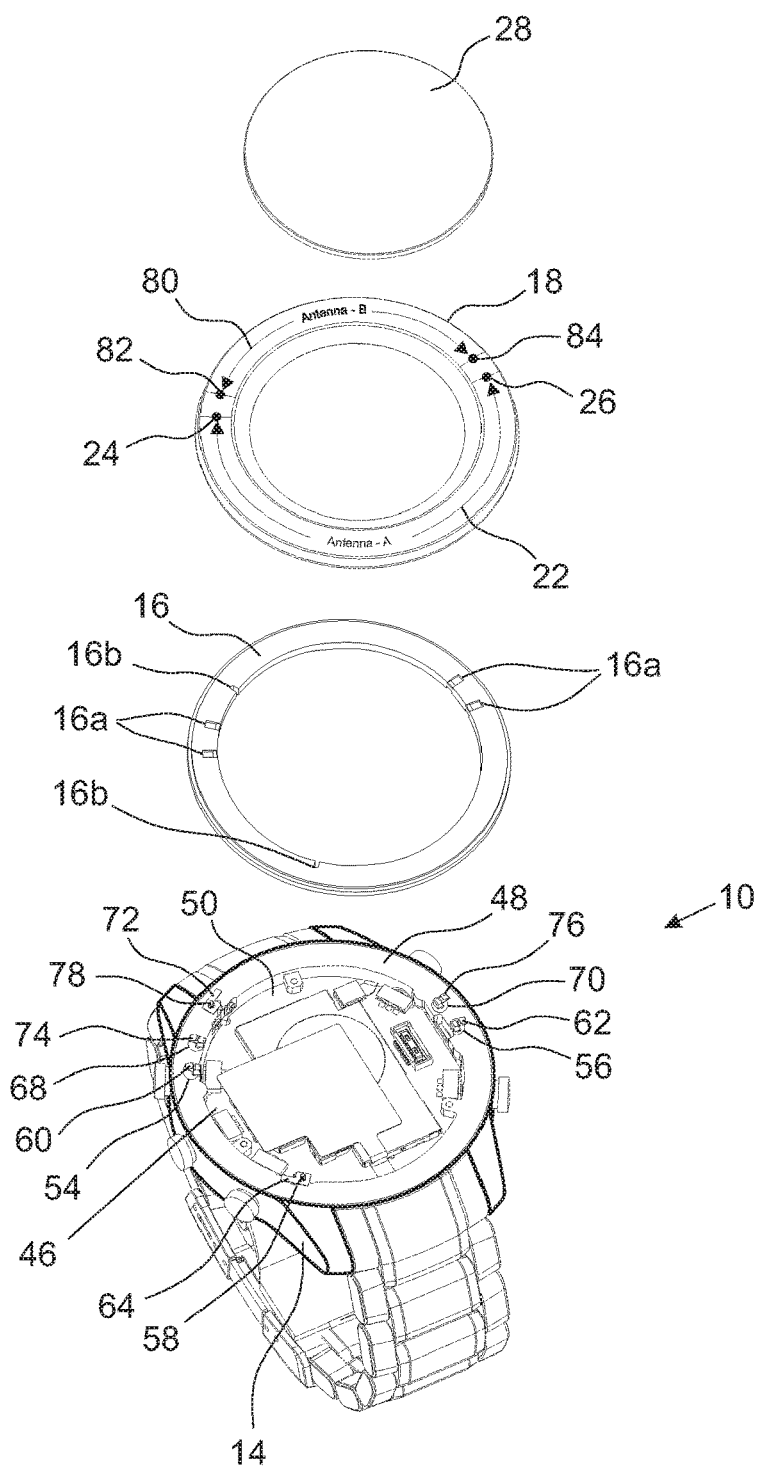
FIG. 6 is an exploded perspective view, from opposing sides, of an electronic device of incorporating an improved antenna configuration with two slot antennas, illustrating a display, a bezel, and a ring removed from a housing, the housing including additional components which, along with the bezel, form a first antenna and a second antenna.

Each electrical connection between the electrical ground locations 24, 26 on a lower surface of the bezel 18 and an electrical terminal on the top surface 48 of the side wall 20 may be formed by an electrically conductive contact 52. In the Figures, the depicted conductive contacts 52 may be compressible spring contacts 60, 62, or a conductive post 64. However, the conductive contacts may be pogo pins, electrically conductive wires, electrically conductive cables, flexible printed circuits, and so forth. In some embodiments, as seen in FIG. 5A, each spring contact 60, 62 may include a compressible portion (at the top) and a rigid portion that wraps around an inner surface of ring 16. The compressible portion of each spring contact 60, 60 may rest within or pass through a conductive area 16a. It is to be understood that conductive contacts 52 may be a compressible spring contact, a post contact, or any combination thereof. Each spring contact 60, 62, as seen in FIGS. 3-5A, may be formed from electrically conductive material, such as metal, and may have a generally elongated, flat shape. In addition, each spring contact 60, 62 may include a first leaf spring within a top half of each spring contact 60, 62 and may be configured to make electrical contact with the lower surface of bezel 18 and a second leaf spring within a bottom half of each spring contact 60, 62 and may be configured to make electrical contact with an electrical ground terminal positioned on a top surface of the side wall 20. Each spring contact 52 may be retained against an inner surface of nonconductive ring 16 or pass through the conductive area 16a within nonconductive ring 16. As shown in FIGS. 3 and 6, the nonconductive ring 16 may include one or more conductive areas 16a that provide alignment for spring contact 60, 62 and electrically couple components on an upper surface and a lower surface of the ring 16. Similarly, the nonconductive ring 16 may include one or more openings 16b through which the conductive post 64 or other electrically conductive element (e.g., pin, wire, cable, etc.) carrying a first electronic signal may pass. For example, in embodiments, a coaxial cable that electrically contacts two electronic signal terminals on the printed circuit board 50 (or on electronic component(s) retained on the printed circuit board 50, such as the location determining component 34 or the communication element 36) and electronic signal terminals 58, 72 positioned above side wall 20 may pass through each opening 16b.

Thus, a conductive contact 52 may form each of the electrical connections between the bezel 18 and two electrical ground terminals 54, 56 as well as between the bezel 18 and the electronic signal terminal 58. In other embodiments, a conductive wire may provide the electrical connection between the bezel and an electrical terminal on the printed circuit board 50. In such embodiments, a separate conductive element may electrically couple each of the electrical ground locations 24, 26 on a lower surface of the bezel 18 with an electrical terminal on the top surface 48 of the side wall 20.

A plurality of electrical terminals are positioned on the top surface 48 of the side wall 20. In embodiments, as shown in FIGS. 3, 4A-4B, and 5A-5B, two conductive contacts 52 (a first spring contact 60 and a second spring contact 62) form an electrical connection between the first and second electrical terminals 54, 56 with the electrical ground locations 24, 26 on a lower surface of the bezel 18, respectively, and a conductive post 64 may physically contact and be electrically coupled with the bezel 18 at a position along the first portion of the circumference of the bezel between the first and second electrical ground locations 24, 26. The two electrical ground terminals on the top surface 48 of the side wall 20 associated with the first antenna 22 may form a first pair of electrical ground terminals.

Figure 4A:
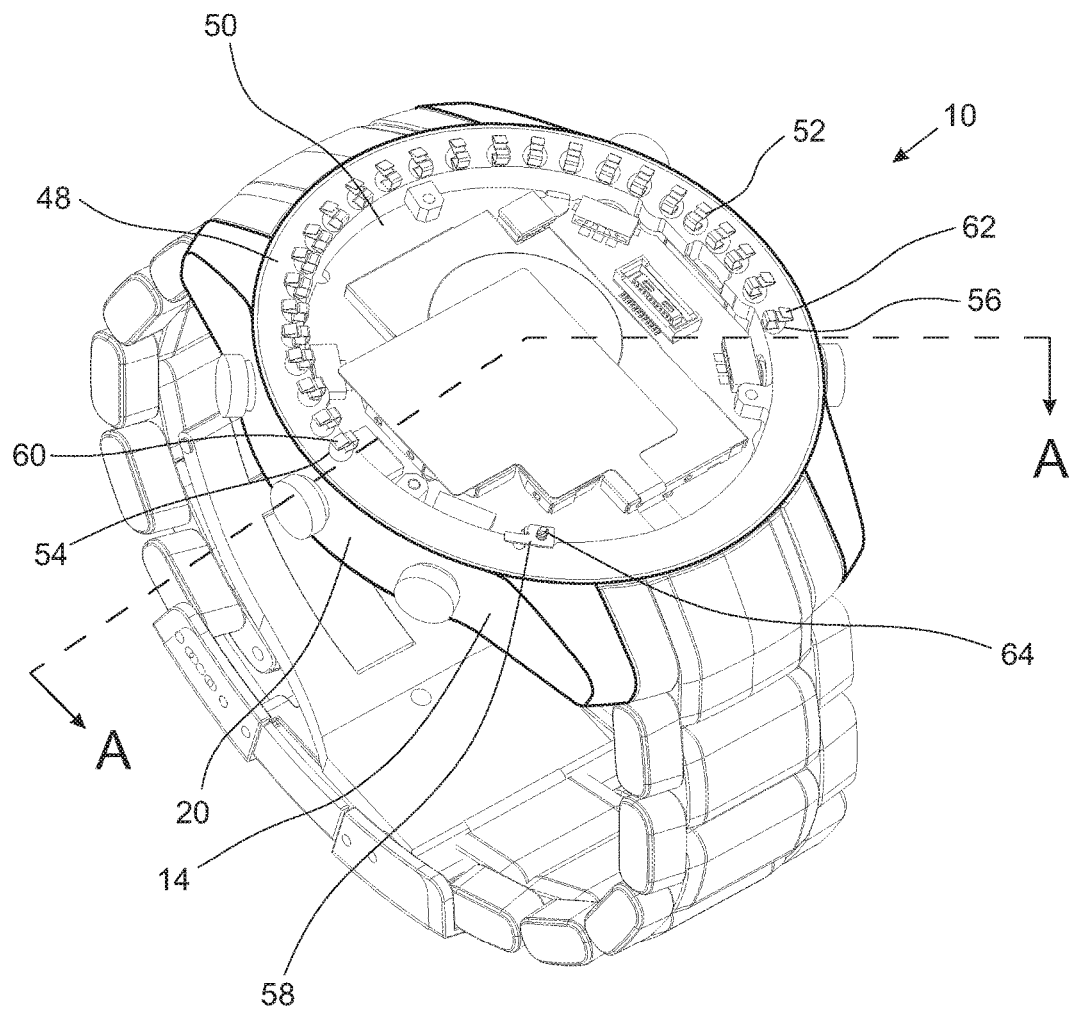
FIGS. 4A and 4B are a perspective view and a top plan view of a portion of the electronic device of FIG. 1 illustrating a printed circuit board, a top surface of a side wall and a plurality of spring contacts, portions of which form a first antenna, without the bezel obstructing said components in FIG. 1A.
Figure 4B:
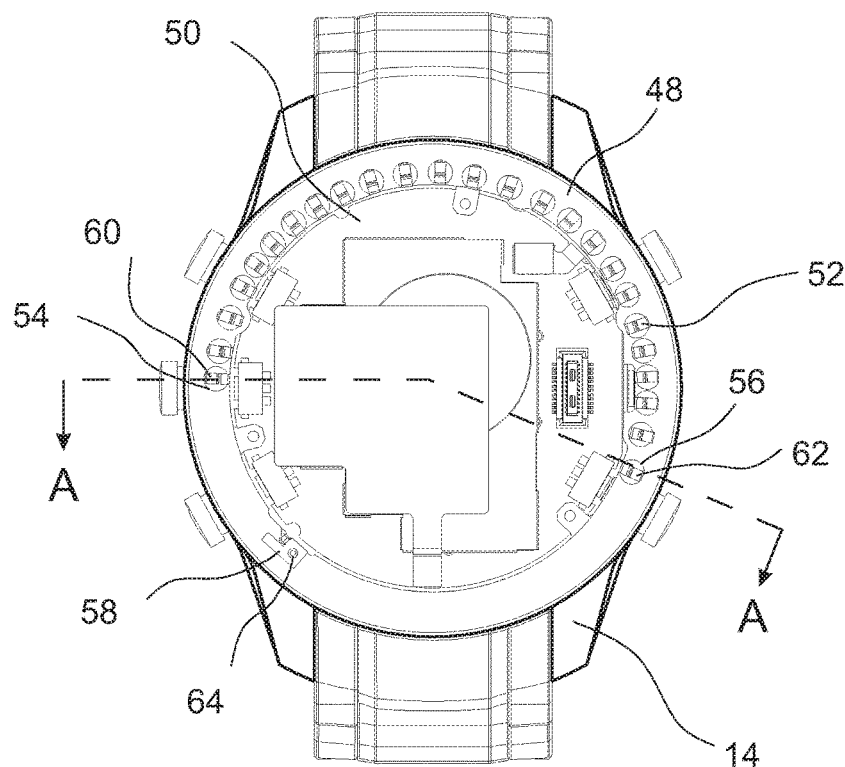

Three of the plurality of electrical terminals, 54, 56, and 58, are illustrated in FIGS. 3 and 4A-4B. Each of the electrical terminals, including electrical terminals 54, 56, and 58, may be electrically coupled with electrical terminals on the printed circuit board 50 that are also electrically coupled with electrical ground or one or more electronic devices within the internal cavity 46 of the electronic device 10, such as the location determining component 34 or the communication element 36. Electrical terminals 54, 56, and 58 may be electrically coupled with three locations of the bezel 18 to form a first portion associated with the first antenna 22. Each of the three locations (two electrical ground (G) locations and an electrical signal feed (F) location), may be electrically coupled to the first and second electrical terminals 54, 56 and an electronic signal terminal 58, respectively, through use of a first spring contact 60, a second spring contact 62 and a conductive post 64, respectively. The first spring contact 60 and the second spring contact 62 physically contact and be electrically coupled with electrical ground locations 24, 26 on a lower surface of the bezel 18. Thus, each of the first and second spring contacts 60, 62 may be an electrical ground contact because each electrically couples electrical ground locations 24, 26 with electrical ground (the ground plane) and the conductive post 64 may be an electrical signal contact because it electrically couples an electrical signal feed (F) location with an electronic device on the printed circuit board 50. For example, the third electrical terminal 62 may be electrically coupled with the location determining component 34 and receive an electronic signal, such as location signals received from a satellite-based positioning system (e.g., GPS). Similarly, the third electrical terminal 62 may be electrically coupled with the communication element 36 and transmit and/or receive RF signals to enable the electronic device 10 to communicate with external systems or devices.

The conductive post 64 physically contacts and is electrically coupled with an electrical signal feed (F) location on a lower surface of the bezel 18. In some embodiments, as shown in FIGS. 3, 4A-4B, 6, and 7A-7B, the conductive posts 64, 78 are physically and electrically coupled with the electronic signal terminals 58, 72 and the bezel 18. In other embodiments, the electronic signal terminals 58, 72 include the conductive posts 64, 78 or otherwise physically and electrically contact the bezel 18 directly.

The first and second electrical terminals 54, 56, which are two electrical ground (G) terminals, on the top surface 48 of the side wall 20 associated with the first antenna 22 form a first pair of electrical ground terminals. The first and second electrical ground locations 24, 26 on a lower surface of bezel 18 associated with the first antenna 22 may form a first pair of electrical ground locations.

The portion of bezel 18 along a circumference of the bezel 18 between the electrical ground locations 24, 26 associated with the first antenna 22 form a first portion of the bezel 18. The first portion of the bezel 18 may be the shorter circumference of the bezel 18 between the electrical ground locations 24, 26 associated with the first antenna 22 or the longer circumference of the bezel 18 between the electrical ground locations 24, 26. In embodiments, as shown in FIGS. 3 and 4A-4B, the performance of antenna 22 may be improved by electrically grounding the portion of bezel 18 along a circumference of the bezel 18 that is not associated with the first antenna 22. In the depicted example, twenty-three (23) electrical terminals and conductive contacts 52 are substantially equally spaced on the top surface 48 of the side wall 20 between the first and second electrical terminals 54, 56 to electrically isolate that portion of the bezel 18 and the side wall 20 from the first portion of bezel 18 and the side wall 20 associated with the first antenna 22.

The conductive post 64 may physically contact and be electrically coupled with the bezel 18 at a position along the first portion of the circumference of the bezel between the first and second electrical ground locations 24, 26, which are the first pair of electrical ground locations, on a lower surface of the bezel 18. Thus, the conductive post 64 may be an electrical signal contact because an electrical signal feed (F) location on bezel 18 is electrically coupled with, and provides a signal feed (F) to, the one or more electronic components, such as a location determining element 34 or a communication element 36, on the printed circuit board 50.

A nonconductive "slot" of first antenna 22 may be formed by a portion of a conductive side wall 20, an air gap, or a combination thereof, bound by an upper portion, a lower portion and side portions. In embodiments, as shown in FIG. 5B, the nonconductive slot 86 of first antenna 22 may be formed by a lower surface of the bezel 18, a top surface 48 of the side wall 20, and electrical connections to the two of the electrical ground terminals to enclose an area that is not electrically conductive. For instance, the nonconductive slot 86 may be formed by a portion of the nonconductive ring 16 located between a lower surface of the bezel 18, a top surface 48 of the side wall 20, and the electrical connections to the two of the electrical ground terminals.

Figure 4C:
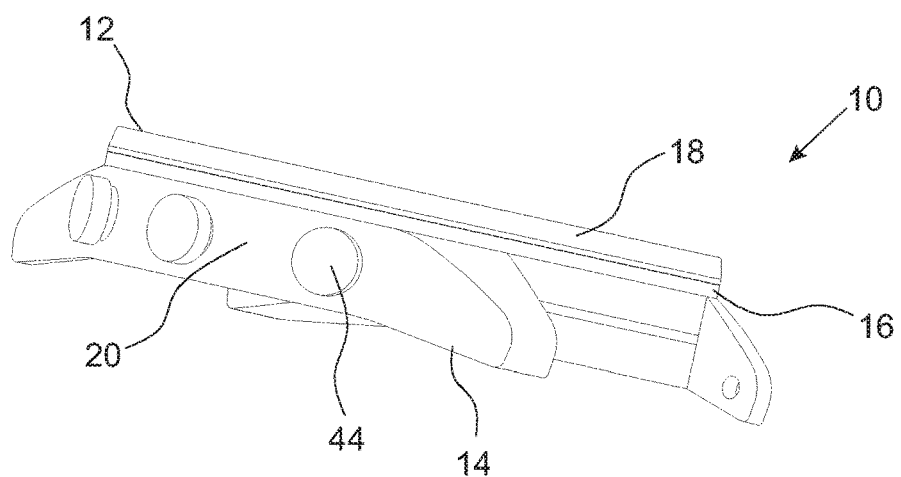
FIG. 4C is a side perspective view of the electronic device of FIG. 1A illustrating an upper housing, a lower housing, and an electrically nonconductive ring.

As shown in FIG. 4C, the electronic device 10 may include a nonconductive ring 16 positioned between the electrically conductive bezel 18 and the conductive side wall 20. In embodiments, the nonconductive ring 16 may form a portion of the upper housing 12 of the electronic device 10. The nonconductive "slot" of first antenna 22, which is a slot antenna, may be formed by a portion of the nonconductive ring 16 located between a lower surface of the bezel 18, a top surface 48 of the side wall 20, and the electrical connections to the two of the electrical ground terminals.

The side wall 20 of the lower housing 14 is formed of an electrically conductive material, such as metal, electrically conductive ceramic, electrically conductive plastic, or combinations thereof. The side wall 20 may be a single, continuous side wall or a plurality of side walls that form an internal cavity 46 when combined with an upper housing 12 and a lower surface of lower housing 14 that contacts a wearer's wrist. The side wall 20 provides structural support between the upper and lower surfaces of the housing. In embodiments, the side wall 20 may be formed of two or more layers, each having a conductivity characteristic common to or varying in comparison to other layer(s). For example, the side wall 20 may have a first conductive upper layer that is formed by a different material than a second conductive lower layer.

The first antenna 22 is at least partially formed by a first nonconductive slot 86 formed between a first portion of the lower surface of the bezel 18 along a circumference of the bezel 18 between a first electrical ground location 24 and a second ground location 26, a first portion of the top surface 48 of the side wall 20 along a circumference of the side wall 20 corresponding to the first portion of the lower surface of the bezel 18, and the electrical connections between the two electrical ground terminals on the top surface 48 of the side wall 20 and the two electrical ground locations 24, 26 on the lower surface of the bezel 18. The first electronic signal terminal 58 and the conductive post 64 form an electrical connection to the bezel 18 at a position along the first portion of the circumference of the bezel between the first pair of electrical ground locations 24, 26.

The length of the first portion of the circumference of the bezel 18 associated with the first antenna 22 may be one-half of a wavelength of the first electronic signal as a result of the slot-antenna configuration achieved by utilizing techniques disclosed herein. The length of an inverted-F antenna is typically a quarter of a wavelength of an electrical signal transmitted or received using the inverted-F antenna, so an inverted-F antenna configuration results in an antenna length that may be one-half the length of a slot-antenna configuration. The length of an inverted-F antenna is typically measured using the length of the upper arm from an open end to an opposite end of the upper arm, which is typically the location of the shorting pin connection. It is to be understood that the length of the portion of bezel 18 associated with the first antenna 22 that must be utilized to receive an electronic signal may account for a larger portion of a bezel 18 having a smaller circumference than a bezel 18 having a larger circumference.

The first antenna 22 may be configured to wirelessly receive a first electronic signal, such as a GPS signal, and communicate the received first electronic signal to a component positioned in the internal cavity 46, such as the location determining component 34. The location determining component 34 may be electrically coupled with the first electronic signal terminal 58 and may process the received first electronic signal to determine a current geolocation of the electronic device 10. Thus, for instance, the length of the first portion of the circumference of the bezel 18 associated with the first antenna 22 may be one-half of a wavelength of the location signals received from a satellite-based positioning system (e.g., GPS).

FIG. 5A illustrates a vertical cross-section view of the internal components of the electronic device 10, as seen through the A-A line of FIGS. 4A and 4B. As seen in this view, upper housing 12 includes the bezel 18 positioned above the nonconductive ring 16 and lower housing 14 includes a side wall 20 and a lower surface 66. Lower housing 14 may enclose the printed circuit board 50a, the processing element 30, the location determining element 34, the communication element 36, and a battery 88. FIG. 5B illustrates a simplified side view of the internal components of the electronic device 10. Similar to FIG. 5A, this view illustrates the lower surface 66 and the side wall 20 of the lower housing 14 and the bezel 18 of upper housing 12. As seen in FIGS. 5A and 5B, the first antenna 22 is formed by a nonconductive slot 86, having a width (W) and a height (H), between the top surface 48 of side wall 20, a lower surface of bezel 18, the first spring contact 60, and the second spring contact 62, that extends along bezel 18 and side wall 20 associated with the first antenna 22 (the portion of bezel 18 labeled "Antenna A" in FIG. 1 between the electrical ground locations 24, 26). In the depicted example, conductive post 64 may electrically couple with a first portion of a circumference of the bezel 18 between first spring contact (G) and second spring contact (G), and an electrically conductive post 64 (or a conductive spring contact) may provide a signal feed (F) to first antenna 22. Typically, the signal feed (F) is electrically connected to a lower surface of bezel 18 at a point away from a midpoint of the first portion of the circumference of the bezel 18 associated with the first antenna 22 (i.e., the signal feed (F) connection point on the lower surface of bezel 18 may be closer to one of the electrical ground locations 24, 26).

In embodiments, the electronic device 10 may include two antennas, the first antenna 22 and a second antenna 80, configured to utilize the slot-antenna configuration. The second antenna 80 may be configured to transmit and receive a second wireless signal, such as Bluetooth™, Wi-Fi, cellular, etc., and may wirelessly transmit and receive a corresponding second electronic signal. The second antenna 80 may be formed from a second electronic signal terminal 72, a third electrical ground terminal 68, a fourth electrical ground terminal 70, and a second portion of the circumference of the bezel 18 extending between a first electrical ground location 82 and a second electrical ground location 84 (depicted on the top surface of bezel 18 for illustrative purposes only). The length of the second portion of the circumference of the bezel associated with the second antenna 80 may be based on a wavelength or frequency (wavelength=c (speed of light)/frequency) of the second electronic signal, which may have a different wavelength (or frequency) in comparison to the first electronic signal. For example, the length of the second portion of the circumference of the bezel 18 associated with the second antenna 80 may be one-half (or one-fourth) of a wavelength of the second electronic signal, which may have a frequency that is twice (double) the frequency of the first electronic signal.

In some embodiments, one or more electrical ground terminals 52 may be provided between the first electrical ground terminal 54 (associated with the first antenna 22) and the third electrical ground terminal 68 (associated with the second antenna 80) to electrically isolate the first antenna 22 from the second antenna 80. Similarly, one or more electrical ground terminals 52 may be provided between the second electrical ground terminal 56 (associated with the first antenna 22) and the fourth electrical ground terminal 70 (associated with the second antenna 80) to electrically isolate the first antenna 22 from the second antenna 80.

In other embodiments, the first antenna 22 and the second antenna 80 may share one or more electrical ground terminals 52 on the top surface 48 of side wall 20. For example, one of the two electrical ground terminals 54, 56 associated with the first antenna 22 may be electrically connected to the second antenna 80 such that the electrical ground terminal 54 or 56 is also associated with the second antenna 80.

Figure 7A:
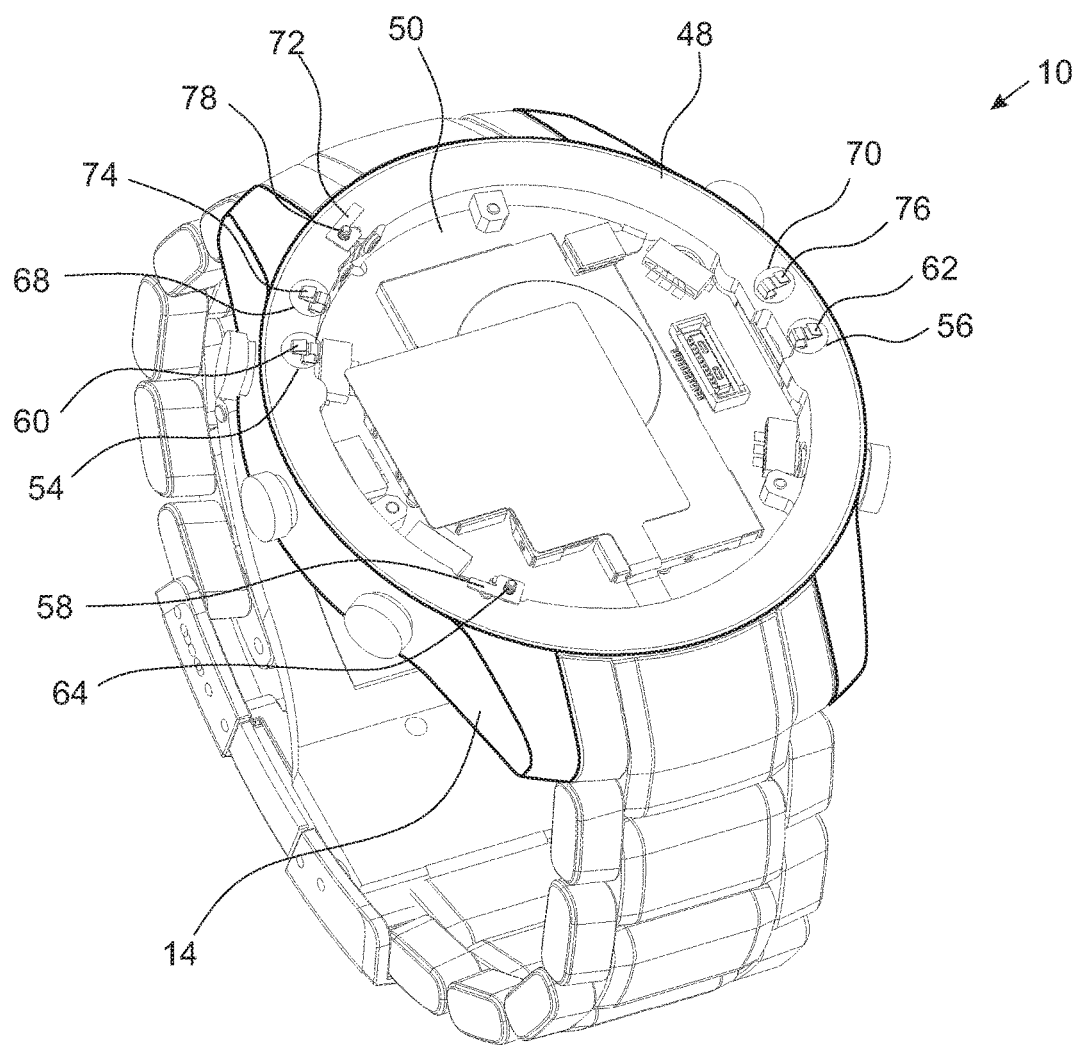
FIGS. 7A and 7B are a perspective view and a top plan view of a portion of the electronic device of FIG. 6 illustrating a printed circuit board, a top surface of a side wall and a plurality of spring contacts, portions of which form a first antenna and the second antenna, without the bezel.
Figure 7B:
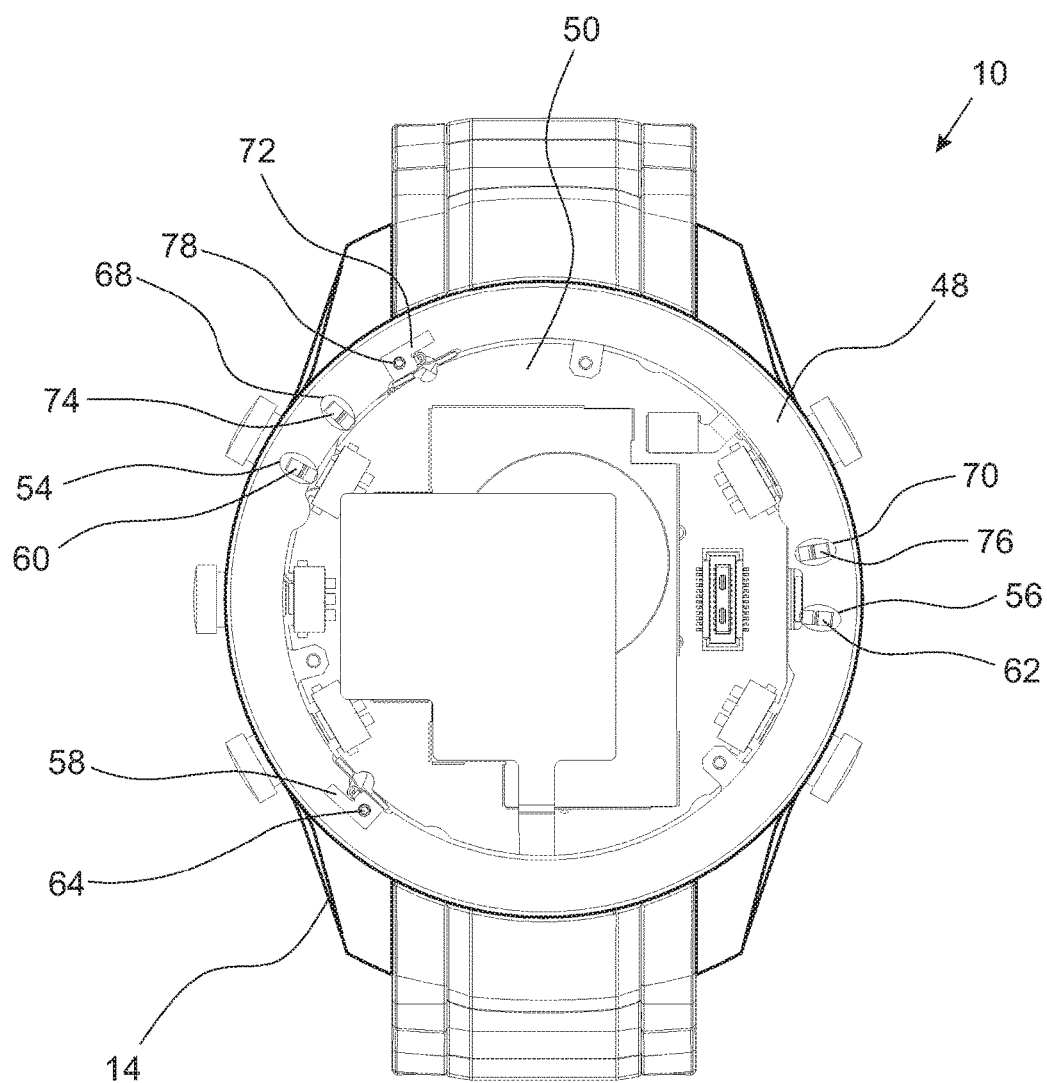

As shown in FIGS. 6-7B, in some embodiments, the first portion of the circumference of the bezel 18 at least partially forming the first antenna 22 does not overlap with the second portion of the circumference of the bezel 18 at least partially forming the second antenna 80. In other embodiments, the first portion of the circumference of the bezel 18 at least partially forming the first antenna 22 may partially overlap with the second portion of the circumference of the bezel 18 at least partially forming the second antenna 80.

The combination of the upper housing 12 and lower housing 14 forms an internal cavity 46 generally housing or retaining other components of the electronic device 10 and may include or be coupled to the wrist strap 42. The internal cavity 46 of the electronic device 10 may be enclosed by the lower housing 14 formed by the lower surface 66 and at least one side wall 20 and by the upper housing 12 formed by a combination of bezel 18, the nonconductive ring 16, and the display 28. The lower surface 66 may include a lower, outer surface that contacts the user's wrist while the user is wearing the electronic device 10. The upper surface 40 opposes the lower surface 66. In various embodiments, the upper surface may further include an opening that extends from the upper surface to the internal cavity 46. Side wall 20 may be a single, continuous side wall or a plurality of side walls that form internal cavity 46 when combined with the lower surface 66 that contacts a wearer's wrist and an opposing upper housing 12. In some embodiments, such as the exemplary embodiments shown in the figures, the lower housing 14 may have a round, circular, or oval shape, with a single circumferential side wall 20. In other embodiments, the lower housing 14 may have a four-sided shape, such as a square or rectangle, or other polygonal shape, with the lower housing 14 including four or more side walls 20. Side wall 20 may include one or more openings for user interface 40 (e.g., depressible buttons 44, rotating knobs, etc.).

A combination of electrically conductive side wall 20 and the nonconductive ring 16 provides structural support between upper housing 12 and the lower surface 66 of the lower housing 14. In embodiments, side wall 20 may be formed of two or more layers, each having a conductivity characteristic common to or varying in comparison to other layer(s) of side wall 20. For example, side wall 20 may have a conductive upper layer that is formed by a different material than a conductive lower layer of side wall 20.

The display 28 generally presents the information mentioned above, such as time of day, current location, and the like. The display 28 may be implemented in one of the following technologies: light-emitting diode (LED), organic LED (OLED), Light Emitting Polymer (LEP) or Polymer LED (PLED), liquid crystal display (LCD), thin film transistor (TFT) LCD, Memory-in-Pixel (MIP) LCD, LED side-lit or back-lit LCD, or the like, or combinations thereof. In some embodiments, the display 28 may have a round, circular, or oval shape. In other embodiments, the display 28 may possess a square or a rectangular aspect ratio which may be viewed in either a landscape or a portrait orientation.

In exemplary embodiments seen in FIGS. 3 and 6 of electronic device 10, the display 28 may be at least partially positioned in the internal cavity 46, such that the display 28 is adjacent to an opening of the bezel 18. It is to be understood that the display 28 of electronic device 10 may include a lens that is positioned on an upper surface of the display 28 to enhance the visibility of the information shown on the display 28. The lens and display 28 may together form a display stack or assembly.

The user interface 40 generally allows the user to directly interact with the electronic device 10 and may include pushbuttons 44, rotating knobs, or the like. The electronic device 10 may include one or more pushbuttons 44 located on the side walls 20 thereof that function as at least a portion of the user interface 40. In various embodiments, the display 28 may also include a touch screen occupying the entire display 28 or a portion thereof so that display 28 functions as at least a portion of the user interface 40. The touch screen may allow a user to interact with the electronic device 10 by physically touching, swiping, or gesturing on areas of the display 28.

The location determining element 34 generally determines a current geolocation of the electronic device 10 and may process a first electronic signal, such as radio frequency (RF) electronic signals, from a global navigation satellite system (GNSS) such as the global positioning system (GPS) primarily used in the United States, the GLONASS system primarily used in the Soviet Union, or the Galileo system primarily used in Europe. The location determining element 34 may include satellite navigation receivers, processors, controllers, other computing devices, or combinations thereof, and memory. The location determining element 34 may be in electronic communication with the first antenna 22, although, in some embodiments, the location determining element 34 may be in electronic communication with the second antenna 80. The first antenna 22 (or the second antenna 80) may wirelessly receive a first electronic signal from one or more of the previously-mentioned satellite systems and provide the first electronic signal to location determining component 18. The location determining element 34 may process the first electronic signal, which includes data and information, from which geographic information such as the current geolocation is determined. The current geolocation may include geographic coordinates, such as the latitude and longitude, of the current geographic location of electronic device 10. The location determining element 34 may communicate the current geolocation to processing element 30.

Although embodiments of the location determining element 34 may include a satellite navigation receiver, it will be appreciated that other location-determining technology may be used. For example, cellular towers or any customized transmitting radio frequency towers can be used instead of satellites may be used to determine the location of the electronic device 10 by receiving data from at least three transmitting locations and then performing basic triangulation calculations to determine the relative position of the device with respect to the transmitting locations. With such a configuration, any standard geometric triangulation algorithm can be used to determine the location of the electronic device. The location determining element 34 may also include or be coupled with a pedometer, accelerometer, compass, or other dead-reckoning components which allow it to determine the location of the electronic device 10. The location determining element 34 may determine the current geographic location through a communications network, such as by using Assisted GPS (A-GPS), or from another electronic device. The location determining element 34 may even receive location data directly from a user. In these alternative embodiments, the location determining element 34 may also be in electronic communication with the first antenna 22.

The communication element 36 generally enables communication between electronic device 10 and external systems or devices. The communication element 36 may include signal or data transmitting and receiving circuits, such as amplifiers, filters, mixers, oscillators, digital signal processors (DSPs), and the like. Various combinations of these circuits may form a transceiver, which transmits, receives, and processes signals such as the ones listed in the following discussion. The communication element 36 may establish communication wirelessly by utilizing radio frequency (RF) signals and/or data that comply with communication standards such as cellular 2G, 3G, 4G, or 5G, Institute of Electrical and Electronics Engineers (IEEE) 802.11 standards such as Wi-Fi, IEEE 802.16 standard such as WiMAX, Bluetooth™, or combinations thereof. In addition, the communication element 36 may utilize communication standards such as ANT, ANT+, Bluetooth™ low energy (BLE), the industrial, scientific, and medical (ISM) band at 2.4 gigahertz (GHz), or the like. The communication element 36 may be in communication with the processing element 30 and the memory element 32. In various embodiments, the electronic device 10 may be configured to establish communication with more than one protocol or standard, and the communication element 36 may include a transceiver for each protocol or standard, such as Bluetooth™, Wi-Fi, cellular, etc., with which the electronic device 10 can communicate. Thus, the communication element 36 may be in electronic communication with the second antenna 80. The second antenna 80 may wirelessly transmit and receive electronic signals to and from exercise-related sensors, such as a heart rate monitor, a foot pod, a bike speed and cadence sensor, or the like, other electronic devices, such as a smartphone, a tablet, a laptop, or a desktop computer, or communication network interfaces such as a Wi-Fi router or a cell tower. The second antenna 80 may also wirelessly transmit and receive electronic signals, derived from the electronic signals, to and from the communication element 36.

The memory element 32 may include data storage components such as read-only memory (ROM), programmable ROM, erasable programmable ROM, random-access memory (RAM), or the like, or combinations thereof. The memory element 32 may include, or may constitute, a "computer-readable medium". The memory element 32 may store the instructions, code, code segments, software, firmware, programs, applications, apps, services, daemons, or the like that are executed by the processing element 30. In some embodiments, the memory element 32 may be embedded in, or packaged in the same package as, the processing element 30. The memory element 32 may also store data such as map, track, or route data, settings, documents, sound files, photographs, movies, images, databases, or the like.

The processing element 30 may include electronic hardware components such as processors, microprocessors (single-core or multi-core), microcontrollers, DSPs, field-programmable gate arrays (FPGAs), analog and/or digital application-specific integrated circuits (ASICs), or the like, or combinations thereof. The processing element 30 may generally execute, process, or run instructions, code, code segments, software, firmware, programs, applications, apps, processes, services, daemons, or the like. The processing element 30 may also include hardware components such as finite-state machines, sequential and combinational logic, and other electronic circuits that can perform the functions necessary for the operation of the current invention. The processing element 30 may be in communication with the other electronic components through serial or parallel links that include universal busses, address busses, data busses, control lines, and the like.

The printed circuit board 50, as seen in FIGS. 3-5A and 6-7B, generally provides a substrate for supplying electric power to, and electronic communication between, the electronic components in internal cavity 46, such as the location determining element 34, the communication element 36, the memory element 32, and the processing element 30. The printed circuit board 50 may be of generally known construction with a first, or top, side and an opposing second, or bottom, side. The printed circuit board 50 may also include multiple electrically conductive layers with a top conductive layer placed on the first side, a bottom conductive layer placed on the second side, one or more inner conductive layers positioned between the first and second sides, and an insulating layer between each pair of adjacent conductive layers. The insulating layers may be formed from rigidized material that includes various combinations of fiberglass, woven glass, matte glass, cotton paper, phenolic cotton paper, polyester, epoxies, epoxy resins, and the like. Each conductive layer may include one or more conductive electronic signal or electrical power or ground traces, one or more signal, power, or ground pads, full or partial power planes, or full or partial ground planes. The conductive layers may be formed from metals typically including copper, but also including nickel, aluminum, gold, silver, palladium, zinc, tin, lead, and the like. In addition, the printed circuit board 50 may include plated through hole vias, blind vias, buried vias, and the like. The electronic components may be implemented in packages which are mounted on the top side, the bottom side, or both sides. The electronic components may communicate with one another through electronic signal traces.

The internal cavity 46 may retain components such as, but not limited to, the location determining element 34, the communication element 36, the processing element 30, the memory element 32, and the printed circuit board 50. Internal cavity 46 may also include a plurality of electrical terminals on the printed circuit board 50 that electrically couple with the plurality of electrical terminals on the top surface 48 of the side wall 20 and a plurality of spring contacts 52. The printed circuit board 50 may include a plurality of electrical terminals formed from electrically conductive material deposited on printed circuit board 50, such as positions along a perimeter of printed circuit board 50. Each electrical terminal may include a strip of conductive material, with space between other electrical terminals. In some embodiments, the terminals may alternatively or additionally be positioned on one or more surfaces, such as the first side of printed circuit board 50. Each electronic signal terminal is electrically connected to one electronic signal trace and each electric ground terminal is electrically connected to electrical ground. The printed circuit board 50 may provide a ground plane for the first antenna 22 and the second antenna 80.

Given that the printed circuit board 50 may be retained within internal cavity 46 of the electronic device 10, the printed circuit board 50 may have an outline shape and perimeter that is generally similar to the shape of the interior of the lower housing 14. In exemplary embodiments, the lower housing 14 is generally circular, and thus, the outline shape of the printed circuit board 50 may be circular, hexagonal or octagonal to approximate the circular shape. Other outline shapes of the printed circuit board 50 are possible including square, rectangular, or even circular. In embodiments, printed circuit board 50 may have an irregular shaped such that it is partially circular and partially rectangular.

The bezel 18 may form or be positioned on an upper surface the upper housing 12 and may generally cover the perimeter edges of or encircle display 28. The bezel 18 may be a ring shaped to conform to the shapes of a circular or oval upper housing 12 and display 28 such that bezel 18 may be positioned around display 28. The bezel 18 may have an outer perimeter, or outer circumference, that is substantially the same shape as the upper surface of upper housing 12 and an inner perimeter, or inner circumference, that is substantially the same shape as the outer perimeter of the display 28. For example, the bezel 18 may have an inner edge with dimensions that are smaller than or approximately equal to the perimeter dimensions of the display 28 and an outer edge with dimensions that are approximately equal to the perimeter dimensions of the upper surface of the housing 12. Thus, the bezel 18 may be circular, square, or rectangular with a central opening through which the display 28 may be viewed. In the exemplary embodiments shown in the figures, bezel 18 may have an annular shape. In various embodiments, the bezel 18 may be aligned with the lens of display 28.

The bezel 18 may be formed from any material that may integrate an electrically conductive material, such as a metal, metallic or semi-metallic material, and may be positioned on or fixedly attached to nonconductive ring 16. In some embodiments, the bezel 18 may be able to rotate in place, roughly around the center of the upper housing 12. In other embodiments, the bezel 18 may be fixedly attached to the ring 16 and may not rotate. In embodiments, the bezel 18 may be integral to upper housing 12. For example, conductive bezel 18 may be a raised or flush portion of the upper housing 12, with a central opening through which display 28 may be viewed, and the conductive bezel 18 may be positioned above the nonconductive ring 16.

As detailed herein, the first antenna 22 generally converts wireless RF electromagnetic radiation (an electronic signal) into a corresponding electronic signal. The nonconductive slot 86 through which the electric field of first antenna 22 passes includes a portion of nonconductive ring 16. A signal transmitted using first antenna 22 having a nonconductive slot within the ring 16 is output (electromagnetically radiates) to the side of the electronic device 10 housing in the far field (based on constructive and destructive interference). Similarly, first antenna 22 may receive a signal output from that direction in the far field or from any other direction.

In some embodiments, the first antenna 22 is in electronic communication with the location determining element 34, such that it is configured to wirelessly receive a GPS signal from GPS satellites. In other embodiments, the first antenna 22 may be configured to wirelessly transmit and receive communication signals to communicate wirelessly with other electronic devices, systems, or networks using communication protocols such as Bluetooth™, Wi-Fi™, or cellular signals.

In embodiments, the nonconductive slot 86 may be formed by a portion of nonconductive ring 16. For example, a nonconductive slot 86 may be formed by a portion of a nonconductive ring 16 defined or enclosed by a portion of the conductive bezel 18 between the first spring contact 60 and the second spring contact 62 (each providing an electrical connection to an electrical ground terminal), a top surface of conductive side wall 20 along a perimeter of the side wall 20 between the first and second spring contacts 60, 62, and the first and second spring contacts 60, 62. An electrically conductive post 64 (or an electrically conductive spring contact) may provide an electrical connection to an electrical signal feed (F).

The second antenna 80 (also a slot antenna) may be substantially similar to the first antenna 22 in function and structure such that it may utilize a slot antenna configuration having a nonconductive slot. Second antenna 80 may utilize a portion of upper housing 12 and lower housing 14 that are not being utilized by or partially overlapping with first antenna 22. Similar to first antenna 22, the second antenna 80 may be configured as a slot antenna including a nonconductive slot formed by a portion of a nonconductive ring 16, an air gap, or a combination thereof. The nonconductive slot may have any three-dimensional shape such as a substantially rectangle, a square, an oval, or a circle shape formed in a portion of upper housing 12 and lower housing 14. The second antenna 80 is a slot antenna having a nonconductive slot in which the "slot" is formed or bound by an upper portion formed by a second portion of a lower surface of bezel 18, a lower portion formed by a second portion of a top surface 48 of side wall 20, and two spring contacts 74, 76 serving as side portions of second antenna 80. The upper portion of second antenna 80, the lower portion of second antenna 80, and the side portions of second antenna 80 are all in electrical and physical contact such that a nonconductive slot, similar to nonconductive slot 86 of the first antenna 22, is formed inside these portions of second antenna 80.

The second antenna 80 may be at least partially formed by a second portion of a circumference of bezel 18 extending in an area of bezel 18 that is not associated with or otherwise utilized by first antenna 22. For instance, as shown in FIG. 6, if the portion of bezel 18 associated with the first antenna 22 extends from the first electrical ground location 24 (G), through a point of bezel 18 physically contacted by conductive post 64 electrically coupled with an electrical signal feed (F) location, to the second electrical ground location 26 (G), the second portion of a circumference of bezel 18 associated with the second antenna 80 may extend between the first electrical ground location 82, through a point of bezel 18 physically contacted by conductive post 78 electrically coupled with an electrical signal feed (F) location, to the second electrical ground location 84 (i.e., the opposite portion of bezel 18).

The lower portion of second antenna 80 is formed by a second portion of a circumference of the side wall 20 extending between spring contacts 74, 76 such that the lower portion of second antenna 80 corresponds to upper portion of second antenna 80. Side portions of second antenna 80 are formed by spring contacts 74, 76.

Conductive post 78 of the second antenna 80 may be electrically coupled with an electrical signal feed (F) location through the second electronic signal terminal 72 positioned on the top surface 48 of the side wall 20. In the exemplary embodiment shown in FIG. 1B, the second antenna 80 is in electrical communication with the communication element 36, such that the second antenna 80 may wirelessly transmit and receive electronic signals to and from other electronic devices, systems, or networks using communication protocols such as Bluetooth™, Wi-Fi™, or cellular signals. As with the first antenna 22, the length of the second portion of the bezel 18 circumference may be based on a half wavelength of the signal that the second antenna 80 is configured to transmit and receive. The half wavelength of the second electronic signal may different than the half wavelength of the first electronic signal, which is transmitted or received by first antenna 22.

Figure 8:
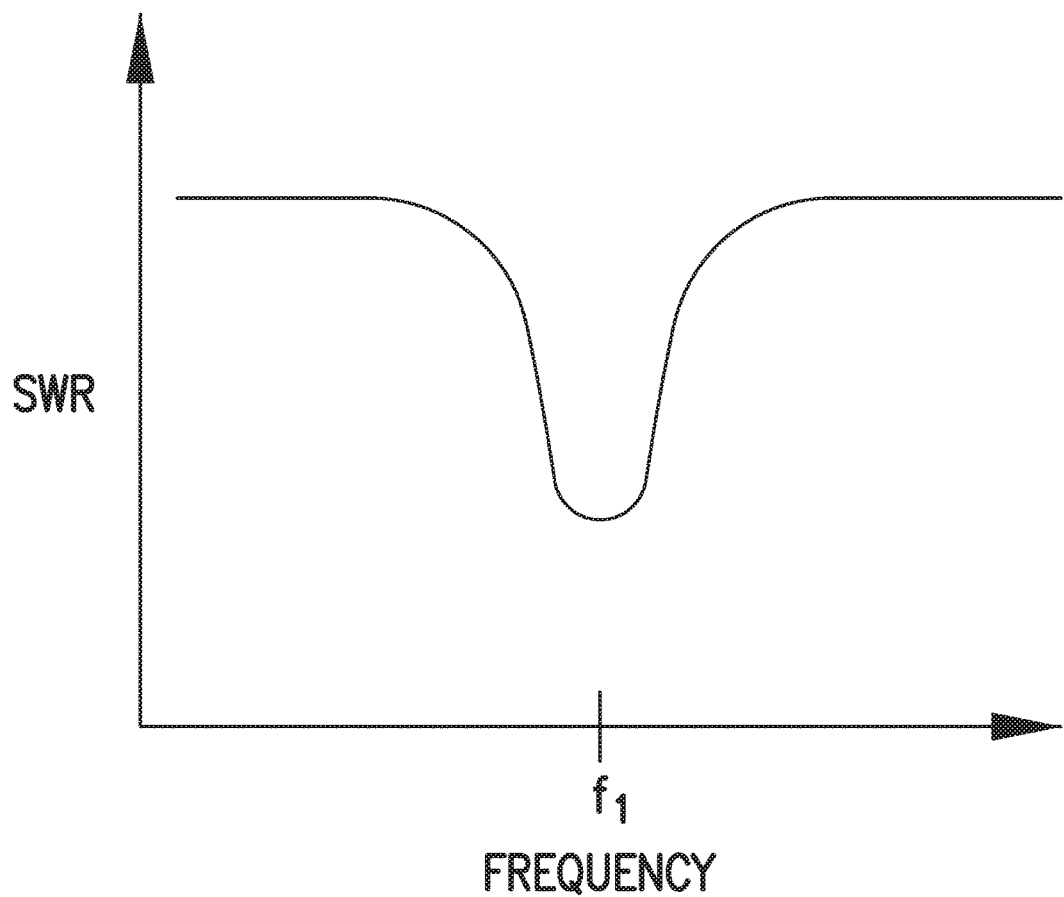
FIG. 8 is an illustrative antenna performance graph for an antenna in accordance with embodiments of the current technology in which standing-wave-ratio (SWR) values are plotted as a function of operating frequency.

FIG. 8 is a graph illustrating antenna performance for first antenna 22 when it is fed a signal in accordance with embodiments of the current technology. The graph provides a plot of standing-wave-ratio (SWR) values as a function of operating frequency. As shown in FIG. 8, first antenna 22 operates in a frequency band approximately centered about a frequency f1, which is determined by a combination of the width (W) and height (H) of nonconductive slot 86. For example, in an embodiment, a width (W) and height (H) of nonconductive slot 86 may be chosen such that the frequency f1 may be equal to one-half wavelength of an electronic signal desired to be transmitted and/or received by first antenna 22. First antenna may thus be tuned to transmit and/or receive desired electronic signals by varying the dimensions of nonconductive slot 86.

Figure 9:
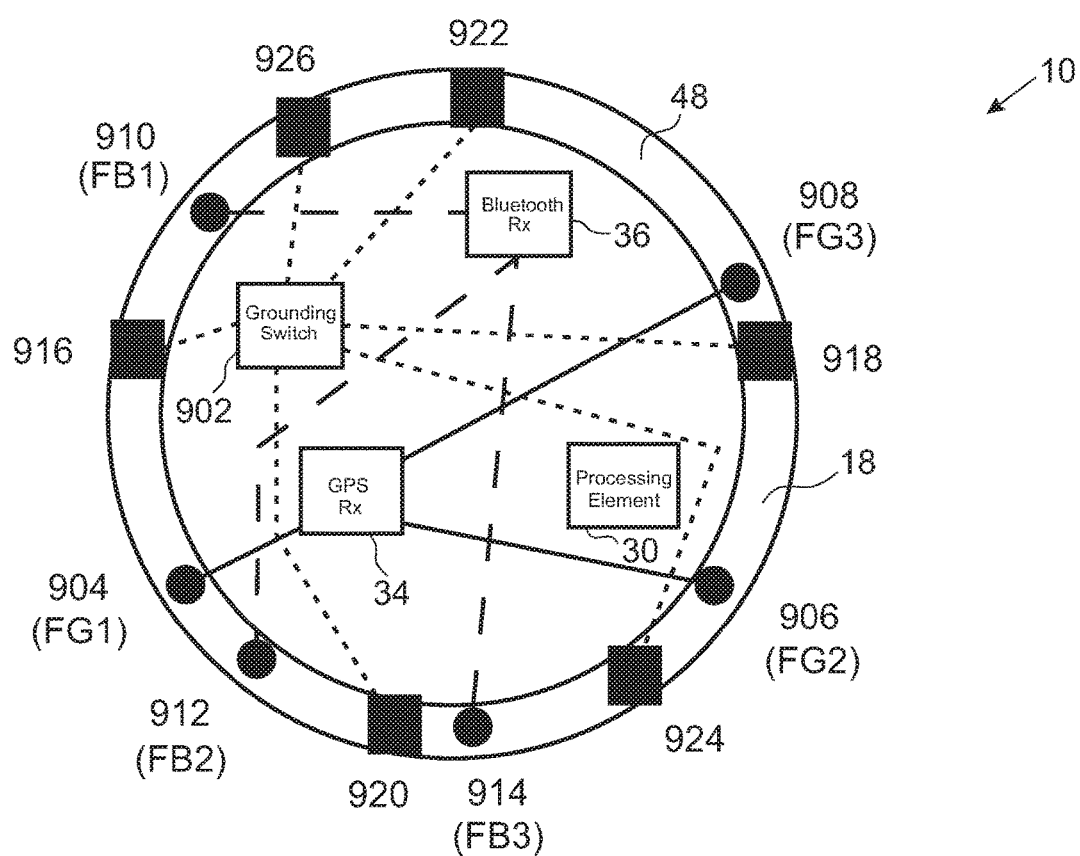
FIG. 9 is a top view of a wrist-worn electronic device incorporating an improved antenna configuration in accordance with embodiments of the current technology.

In some embodiments, the processing element 30 may select an aperture for an electronic signal transmitted and/or received by the first antenna 22 and an aperture for an electronic signal transmitted and/or received by the second antenna 80. As shown in FIG. 9, the electronic device 10 may include a location determining element 34 (e.g., a GPS receiver), a communication element 36 (e.g., a Bluetooth receiver), and a grounding switch 902. As discussed above, the electronic device 10 may also include on a top surface 48 of side wall 20 including a plurality of electronic signal terminals 64, 72 and a plurality of electronic ground terminals 54, 56, 68, 70.

In embodiments, the processing element 30 may select two of a plurality of electronic ground terminals to be electrically grounded. The processing element 30 may also select one of electronic signal terminals 904, 906 or 908 to provide a signal feed (F) for the first antenna 22 and/or one of electronic signal terminals 910, 912, or 914 to provide a signal feed (F) for the second antenna 80. In embodiments, the signal feed (F) for the first antenna 22 may be a GPS signal and the signal feed (F) for the second antenna 80 may be a communication signal (e.g., Bluetooth, Wi-Fi, etc.).

Due to the changing orientation and position of the electronic device 10 while it is worn on the wrist of a user, the processing element may select portions of the bezel 18 (and side wall 20 as well as corresponding spring contacts) associated with one or more antennas 22, 80 that provide adequate or optimal antenna performance. In embodiments, the processing element 30 may be electrically coupled with and configured to control the grounding switch 902 to cause selection of a first aperture or a second aperture for the first antenna 28 and/or the second antenna 80. The processing element 30 may control the grounding switch 902 to electrically ground two of the plurality of electronic ground terminals. The processing element 30 may control the grounding switch 902 to cause a closed circuit for the selected electronic ground terminals and any unselected electronic ground terminals that are not located in a portion of the side wall 20 corresponding to the nonconductive slot 86. The processing element 30 may also control the grounding switch 902 to cause an open circuit for the unselected electronic ground terminals in a portion of the side wall 20 corresponding to the nonconductive slot 86 to enable the two selected electronic ground terminals defining the sides of the nonconductive slot 86 to be electrically grounded. After the selection of the second aperture for the first antenna 28, the two electrical ground locations 24, 26 have moved to a selected (new) position and the second aperture for the nonconductive slot 86 is formed between a second portion (different than the original portion associated with the first aperture) of the lower surface of the bezel 18 along a circumference of the bezel 18 between the two selected electrical ground locations 24, 26. The nonconductive slot 86 may also be formed by a second portion of the top surface of the side wall 20 along a circumference of the side wall 20 corresponding to the second portion of the lower surface of the bezel 18 and the selected electrical ground terminals and ground contacts, which are each electrically coupling the selected electrical ground terminals on the top surface of the side wall 20 with one of the two electrical ground locations 24, 26 on the lower surface of the bezel 18, respectively.

As shown in FIGS. 3 and 6, if the two electrical ground terminals 54, 56 on the top surface 48 of the side wall 20 associated with the first antenna 22 form a first pair of electrical ground terminals and result in a first antenna aperture, the processing element 30 may control the grounding switch 902 to cause selection of two electrical ground terminals other than the first pair of electrical ground terminals to result in a second antenna aperture for the first antenna 22. For instance, the first antenna aperture associated with the first pair of electrical ground terminals 54, 56 may point straight up (if the electronic device 10 is held upright facing the user) and selection of two other electrical ground terminals may result in a second antenna aperture that may point straight down when similarly oriented, which may result in improved antenna performance for the first antenna 22.

In embodiments, each electronic signal terminal 904, 906 and 908 configured to provide a signal feed (F) for the first antenna 22 and each electronic signal terminals 910, 912, and 914 configured to provide a signal feed (F) for the second antenna 80 may be coupled to a signal switch. The processing element 30 may be electrically coupled with each signal switch and control any of them to be electrically closed (passing an electrical signal), electrically open or electrically grounded. The processing element 30 may control one of signal switches to select one of electronic signal terminals 904, 906 or 908 to provide a signal feed (F) for the first antenna 22 and cause the two unselected electronic signal terminals 904, 906 or 908 to be an open circuit or electrically grounded. Similarly, the processing element 30 may control one of signal switches to select one of electronic signal terminals 910, 912, or 914 to provide a signal feed (F) for the second antenna 80 and cause the two unselected electronic signal terminals 910, 912, or 914 to be an open circuit or electrically grounded.

Figure 10A:
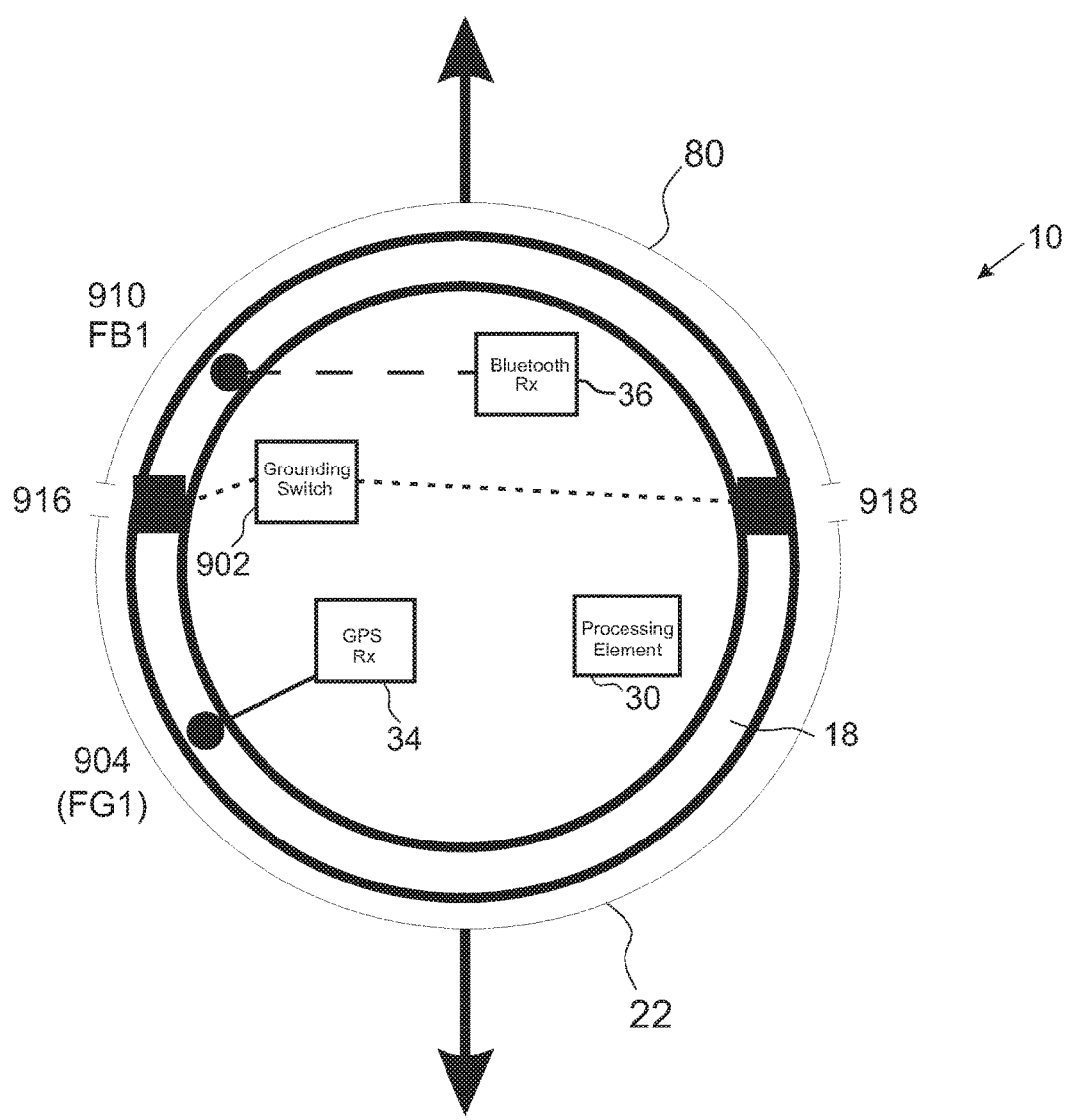
FIGS. 10A to 10C are top views of the electronic device of FIG. 9, each figure of a selected signal feed and electrical ground points.

For example, the processing element 30 may control grounding switch 902 to cause selection of electronic ground terminals 916, 918 and the processing element 30 may control signal switches to select electronic signal terminals 904, 910 to provide a signal feed (F) for the first antenna 22 and the second antenna 80, respectively. As shown in FIG. 10A, selection of electronic ground terminals 916, 918 may result in a first portion of the top surface 48 of the side wall 20 and a corresponding portion of bezel 18 to be associated with the first antenna 22 and a second portion of the top surface 48 of the side wall 20 and a corresponding portion of bezel 18 to be associated with the second antenna 80. The aperture of the first antenna 22 does not overlap with, and its direction is opposite to the direction of the aperture of the second antenna 80. FIG. 10A illustrates the aperture of the first antenna 22 as pointing down and the aperture of the second antenna 80 as pointing up.

Figure 10B:
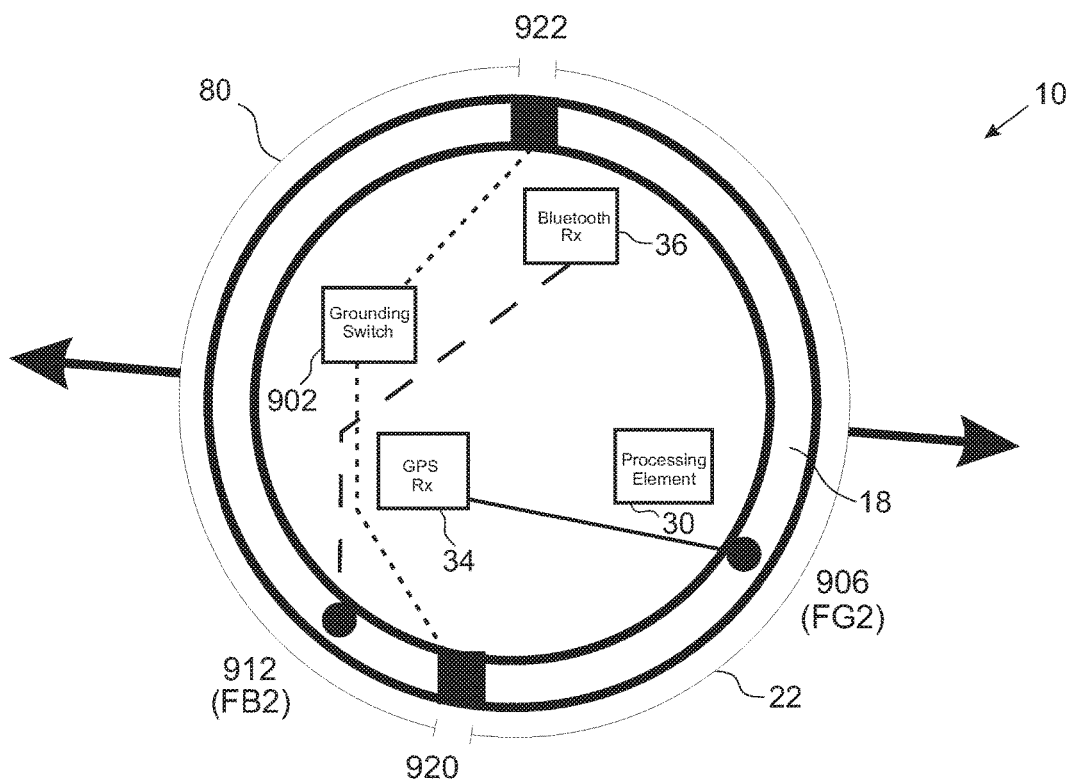

Similarly, the processing element 30 may control grounding switch 902 to cause selection of electronic ground terminals 920, 922 and the processing element 30 may control signal switches to select electronic signal terminals 906, 912 to provide a signal feed (F) for the first antenna 22 and the second antenna 80, respectively. As shown in FIG. 10B, selection of electronic ground terminals 920, 922 may result in a first portion of the top surface 48 of the side wall 20 and a corresponding portion of bezel 18 to be associated with the first antenna 22 and a second portion of the top surface 48 of the side wall 20 and a corresponding portion of bezel 18 to be associated with the second antenna 80. The aperture of the first antenna 22 does not overlap with, and its direction is opposite to the direction of the aperture of the second antenna 80. FIG. 10B illustrates aperture of the first antenna 22 as pointing right and the aperture of the second antenna 80 as pointing left.

Figure 10C:
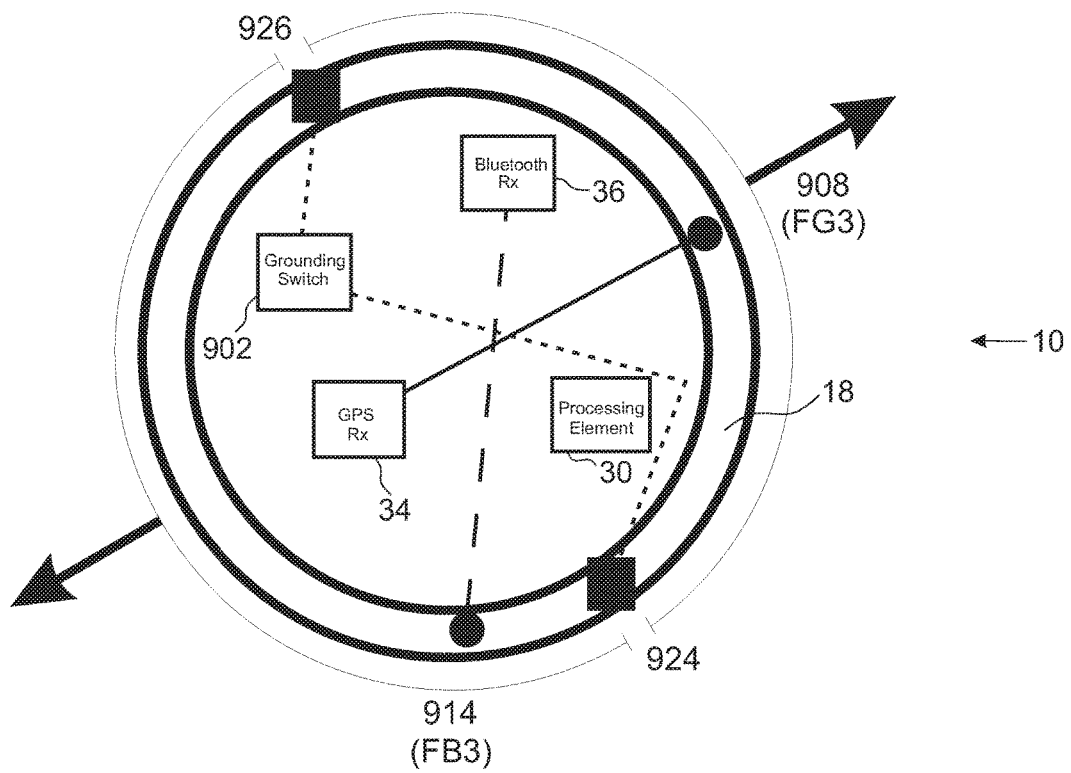

Similarly, the processing element 30 may control grounding switch 902 to cause selection of electronic ground terminals 924, 926 and the processing element 30 may control signal switches to select electronic signal terminals 908, 914 to provide a signal feed (F) for the first antenna 22 and the second antenna 80, respectively. As shown in FIG. 10C, selection of electronic ground terminals 924, 926 may result in a first portion of the top surface 48 of the side wall 20 and a corresponding portion of bezel 18 to be associated with the first antenna 22 and a second portion of the top surface 48 of the side wall 20 and a corresponding portion of bezel 18 to be associated with the second antenna 80. The aperture of the first antenna 22 does not overlap with, and its direction is opposite to the direction of the aperture of the second antenna 80. FIG. 10C illustrates the aperture of the first antenna 22 as diagonally opposing the aperture of the second antenna 80.

In embodiments, the processing element 30 may determine a signal strength of the GPS signal and the communication signal and control the grounding switch 902 to cause selection of two electronic ground terminals based on the determined signal strengths. For example, the processing element 30 may control grounding switch 902 to select two electronic ground terminals that will result in transmission and/or receipt of the GPS signal and the communication signal with signal strengths that meet or exceed threshold values stored in memory element 32. Similarly, the processing element 30 may control grounding switch 902 to select two electronic ground terminals that will result in transmission and/or receipt of the GPS signal and the communication signal with the best signal strengths of the selectable apertures. It is to be understood that the processing element 30 may select one of electronic signal terminals 904, 906 or 908 to provide a signal feed (F) for the first antenna 22 or one of electronic signal terminals 910, 912, or 914 to provide a signal feed (F) for the second antenna 80, such only one of the location determining element 34 (e.g., a GPS receiver) or the communication element 36 (e.g., a Bluetooth receiver) may transmit and/or receive a signal.

In embodiments, the processing element 30 may determine antenna performance for the first antenna 22 having the first aperture, control the grounding switch 902 to select the second aperture for the first antenna 22, determine antenna performance for the first antenna 22 having the second aperture, and automatically select the antenna aperture providing optical antenna performance. The processing element 30 may be configured to perform this process periodically or continuously.

The first and second antennas 22, 80 have been presented as each receiving a particular type of signal and being embodied by a particular type of antenna. It is to be understood that either antenna 22, 80 may be configured to receive any type of signal and/or be embodied by any type of antenna. For example, the first antenna 22 may be configured to receive a Bluetooth™ signal. The second antenna 80 may be configured to receive a GPS signal, and so forth.

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

What is claimed is:

1. A wrist-worn electronic device comprising:
    a lower housing including a lower surface, a printed circuit board positioned above the lower surface, and a side wall formed of electrically conductive material, the side wall having a top surface including a plurality of electrical ground terminals;
    an upper housing opposing the lower housing, the upper housing including a bezel formed of an electrically conductive material, the bezel having a lower surface corresponding to the top surface of the side wall and two electrical ground locations electrically coupled to two of the plurality of electrical ground terminals on the top surface of the side wall;
    an electrically nonconductive ring between the lower surface of the bezel and the top surface of the side wall;
    a first antenna configured to wirelessly transmit or receive a first electronic signal and formed by a first nonconductive slot formed between a first portion of the lower surface of the bezel along a circumference of the bezel between the two electrical ground locations, a first portion of the top surface of the side wall along a circumference of the side wall corresponding to the first portion of the lower surface of the bezel, and two electrical ground contacts each electrically coupling one of the two electrical ground terminals on the top surface of the side wall with one of the two electrical ground locations on the lower surface of the bezel, respectively;
    a first electronic signal terminal; and
    a communication element positioned on the printed circuit board and electrically coupled with the first electronic signal terminal, the communication element configured to transmit to or receive from the first antenna the first electronic signal to communicate with another electronic device or a communication network
    wherein a height of the first nonconductive slot corresponds to a height of the electrically nonconductive ring.

2. The wrist-worn electronic device of claim 1, wherein the two electrical ground terminals on the top surface of the side wall associated with the first antenna form a first pair of electrical ground terminals, and wherein the electrically nonconductive ring includes at least two openings through which the two electrical ground contacts pass to electrically couple the bezel with the two electrical ground terminals on the top surface of the side wall associated with the first antenna.

3. The wrist-worn electronic device of claim 1, further comprising a first electrical signal contact electrically coupling the first electronic signal terminal with the bezel at a position along the first portion of the circumference of the bezel between the first pair of electrical ground locations, wherein the electrically nonconductive ring includes at least one opening through which the first electrical signal contact passes to electrically couple the bezel with the first electronic signal terminal associated with the first antenna.

4. The wrist-worn electronic device of claim 3, wherein the two electrical ground contacts are electrically conductive spring contacts, and wherein the first electrical signal contact is an electrically conductive post.

5. The wrist-worn electronic device of claim 1, wherein printed circuit board is electrically coupled to the conductive side wall, and wherein the combination of the printed circuit board and the side wall form a ground plane for the first antenna.

6. The wrist-worn electronic device of claim 1, wherein the length of the first portion of the circumference of the bezel associated with the first antenna is one-half of a wavelength of the first electronic signal.

7. The wrist-worn electronic device of claim 2, further comprising:
    a second antenna formed by a second nonconductive slot formed between a second portion of a lower surface of the bezel along a circumference of the bezel between two electrical ground locations electrically coupled to two of the plurality of electrical ground terminals on the top surface of the side wall, a second portion of the top surface of the side wall along a circumference of the side wall corresponding to the second portion of the lower surface of the bezel, and two electrical ground contacts each electrically coupling one of the two electrical ground terminals on the top surface of the side wall with one of the two electrical ground locations on the lower surface of the bezel, respectively;
    a second electronic signal terminal; and
    a location determining element positioned on the printed circuit board and electrically coupled with the second electronic signal terminal, the location determining element configured to receive the second electronic signal from the second electronic signal terminal and determine a current geolocation of the electronic device based on the first electronic signal;
    wherein the two electrical ground terminals associated with the second antenna form a second pair of electrical ground terminals.

8. The wrist-worn electronic device of claim 7, further comprising a second electrical signal contact electrically coupling the second electronic signal terminal with the bezel at a position along the second portion of the circumference of the bezel between the second pair of electrical ground locations.

9. The wrist-worn electronic device of claim 7, wherein the length of the second portion of the circumference of the bezel associated with the second antenna is one-half of a wavelength of the second electronic signal.

10. The wrist-worn electronic device of claim 7, wherein the first pair of electrical ground terminals and the second pair of electrical ground terminals are positioned on the top surface of the side wall such that the first portion of the circumference of the bezel associated with the first antenna does not overlap with the second portion of the circumference of the bezel associated with the second antenna.

11. The wrist-worn electronic device of claim 2, further comprising a switch electrically coupled with the plurality of electrical ground terminals including the electrical ground locations and a processing element electrically coupled with the switch;
 wherein the first antenna is associated with a first aperture formed by the first nonconductive slot;
 wherein the processing element is configured to:
  select a second aperture for the first antenna, and
  control the switch to electrically ground two of the plurality of electrical ground terminals other than the first pair of electrical ground terminals;
 wherein the second aperture for the first nonconductive slot is formed between a second portion of the lower surface of the bezel along a circumference of the bezel between the two electrical ground locations, a second portion of the top surface of the side wall along a circumference of the side wall corresponding to the second portion of the lower surface of the bezel, and two electrical ground contacts each electrically coupling one of the two electrical ground terminals on the top surface of the side wall with one of the two electrical ground locations on the lower surface of the bezel, respectively.

12. A wrist-worn electronic device comprising:
 a lower housing including a lower surface, a printed circuit board positioned above the lower surface, and a side wall formed of electrically conductive material, the side wall having a top surface including a plurality of electrical ground terminals;
 a first electronic signal terminal configured to receive a first electronic signal;
 an upper housing opposing the lower housing, the upper housing including a bezel formed of an electrically conductive material, the bezel having a lower surface corresponding to the top surface of the side wall and two electrical ground locations electrically coupled to two of the plurality of electrical ground terminals on the top surface of the side wall;
 an electrically nonconductive ring between the lower surface of the bezel and the top surface of the side wall;
 a first antenna configured to wirelessly receive the first electronic signal and formed by a first nonconductive slot formed between a first portion of the lower surface of the bezel along a circumference of the bezel between the two electrical ground locations, a first portion of the top surface of the side wall along a circumference of the side wall corresponding to the first portion of the lower surface of the bezel, and two electrical ground contacts each electrically coupling one of the two electrical ground terminals on the top surface of the side wall with one of the two electrical ground locations on the lower surface of the bezel, respectively;
 a communication element positioned on the printed circuit board and electrically coupled with the first electronic signal terminal, the communication element configured to transmit to or receive from the first antenna a first electronic signal to communicate with another electronic device or a communication network
 a first electrical signal contact electrically coupling the first electronic signal terminal with the bezel at a position along the first portion of the circumference of the bezel between the two electrical ground locations;
 wherein a height of the first nonconductive slot corresponds to a height of the electrically nonconductive ring.

13. The wrist-worn electronic device of claim 12, wherein the two electrical ground contacts are electrically conductive spring contacts, wherein the first electrical signal contact is an electrically conductive post, and wherein the electrically nonconductive ring includes at least one opening through which the first electrical signal contact passes to electrically couple the bezel with the first electronic signal terminal associated with the first antenna.

14. The wrist-worn electronic device of claim 12, wherein the two electrical ground terminals on the top surface of the side wall associated with the first antenna form a first pair of electrical ground terminals, and wherein the electrically nonconductive ring includes at least two openings through which the two electrical ground contacts pass to electrically couple the bezel with the two electrical ground terminals on the top surface of the side wall associated with the first antenna.

15. The wrist-worn electronic device of claim 14, further comprising:
 a second antenna formed by a second nonconductive slot formed between a second portion of a lower surface of the bezel along a circumference of the bezel between two electrical ground locations electrically coupled to two of the plurality of electrical ground terminals on the top surface of the side wall, a second portion of the top surface of the side wall along a circumference of the side wall corresponding to the second portion of the lower surface of the bezel, and two electrical ground contacts each electrically coupling one of the two electrical ground terminals on the top surface of the side wall with one of the two electrical ground locations on the lower surface of the bezel, respectively,
 a second electronic signal terminal;
 a location determining element positioned on the printed circuit board and electrically coupled with the second electronic signal terminal, the location determining element configured to receive the second electronic signal from the second electronic signal terminal and determine a current geolocation of the electronic device based on the first electronic signal;
 wherein the two electrical ground terminals associated with the second antenna form a second pair of electrical ground terminals.

16. The wrist-worn electronic device of claim 15, further comprising a second electrical signal contact electrically coupling the second electronic signal terminal with the bezel at a position along the second portion of the circumference of the bezel between the second pair of electrical ground locations, and wherein the first pair of electrical ground terminals and the second pair of electrical ground terminals are positioned on the top surface of the side wall such that the first portion of the circumference of the bezel associated with the first antenna does not overlap with the second portion of the circumference of the bezel associated with the second antenna.

17. The wrist-worn electronic device of claim 15, wherein the length of the first portion of the circumference of the bezel associated with the first antenna is one-half of a wavelength of the first electronic signal, and wherein the length of the second portion of the circumference of the bezel associated with the second antenna is one-half of a wavelength of the second electronic signal.

18. The wrist-worn electronic device of claim 15, wherein printed circuit board is electrically coupled to the conductive side wall, and wherein the combination of the printed circuit board and the side wall form a ground plane for the first antenna and the second antenna.

19. A wrist-worn electronic device comprising:
- a lower housing including a lower surface, a printed circuit board positioned above the lower surface, and a side wall formed of electrically conductive material, the side wall having a top surface including a plurality of electrical ground terminals;
- a first electronic signal terminal configured to receive a first electronic signal;
- an upper housing opposing the lower housing, the upper housing including a bezel formed of an electrically conductive material, the bezel having a lower surface corresponding to the top surface of the side wall and two electrical ground locations electrically coupled to two of the plurality of electrical ground terminals on the top surface of the side wall;
- an electrically nonconductive ring between the lower surface of the bezel and the top surface of the side wall;
- a first antenna configured to wirelessly receive the first electronic signal and formed by a first nonconductive slot formed between a first portion of the lower surface of the bezel along a circumference of the bezel between the two electrical ground locations, a first portion of the top surface of the side wall along a circumference of the side wall corresponding to the first portion of the lower surface of the bezel, and two electrical ground contacts each electrically coupling one of the two electrical ground terminals on the top surface of the side wall with one of the two electrical ground locations on the lower surface of the bezel, respectively;
- a communication element positioned on the printed circuit board and electrically coupled with the first electronic signal terminal, the communication element configured to transmit to or receive from the first antenna the first electronic signal to communicate with another electronic device or a communication network
- a first electrical signal contact electrically coupling the first electronic signal terminal with the bezel at a position along the first portion of the circumference of the bezel between the electrical ground locations electrically coupling the bezel and the two electrical ground terminals on the top surface of the side wall associated with the first antenna;
- wherein a height of the first nonconductive slot corresponds to a height of the electrically nonconductive ring.

20. The wrist-worn electronic device of claim 19, wherein the two electrical ground contacts are electrically conductive spring contacts and wherein the first electrical signal contact is an electrically conductive post, and wherein a combination of the side wall and the electrically nonconductive ring provide structural support for the upper housing.

* * * * *